United States Patent
Kawaguchi et al.

(10) Patent No.: US 7,675,218 B2
(45) Date of Patent: Mar. 9, 2010

(54) DRIVE APPARATUS OF PIEZOELECTRIC ACTUATOR, ELECTRONIC APPARATUS, DRIVE METHOD OF ELECTRONIC APPARATUS, DRIVE CONTROL PROGRAM OF ELECTRONIC APPARATUS, AND MEDIUM

(75) Inventors: Takashi Kawaguchi, Shiojiri (JP); Akihiro Sawada, Matsumoto (JP); Yutaka Yamazaki, Suwa (JP); Makoto Okeya, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 847 days.

(21) Appl. No.: 11/076,065

(22) Filed: Mar. 10, 2005

(65) Prior Publication Data

US 2007/0278976 A1 Dec. 6, 2007

(30) Foreign Application Priority Data

Mar. 10, 2004 (JP) ............................. 2004-067562

(51) Int. Cl.
*H01L 41/09* (2006.01)
(52) U.S. Cl. ...................................... 310/317; 310/318
(58) Field of Classification Search .................. 310/317
See application file for complete search history.

(56) References Cited

U.S. PATENT DOCUMENTS

| | | | |
|---|---|---|---|
| 4,973,876 A | 11/1990 | Roberts | |
| 5,061,882 A | 10/1991 | Takagi | |
| 5,130,619 A | 7/1992 | Izuno | |
| 5,563,811 A * | 10/1996 | Embree | 702/86 |
| 5,612,598 A | 3/1997 | Fukui et al. | |
| 5,726,361 A * | 3/1998 | Ogawa | 73/663 |
| 6,472,796 B1 * | 10/2002 | Hoffmann et al. | 310/316.03 |
| 2004/0190886 A1 * | 9/2004 | Tomita | 396/55 |

FOREIGN PATENT DOCUMENTS

| | | |
|---|---|---|
| EP | 0562817 A2 | 9/1993 |
| JP | H06-141566 A | 5/1994 |
| JP | H08-80068 A | 3/1996 |
| JP | H08-275560 A | 10/1996 |
| JP | H08-308267 A | 11/1996 |
| JP | H11-178362 A | 7/1999 |
| JP | 2002223576 A | 8/2002 |

* cited by examiner

*Primary Examiner*—Walter Benson
*Assistant Examiner*—Bryan P Gordon
(74) *Attorney, Agent, or Firm*—Global IP Counselors, LLP

(57) ABSTRACT

An electronic device comprising a power source, a piezoelectric actuator A, and a drive control apparatus 100 for controlling the driving of the piezoelectric actuator, wherein the drive control apparatus 100 is provided with a drive circuit 111 for supplying a drive signal SDR to the piezoelectric element of the vibrating body 12, a phase difference detection means 120 for detecting the phase difference indicating the vibration state of the vibrating body 12, a comparison voltage setting circuit 133 for correcting the target phase difference to be the target for the vibration state, and a drive frequency setting means 140 for comparing the phase difference with the target phase difference; and the piezoelectric actuator A can be driven with high efficiency independent of the drive voltage by modifying the drive frequency of the drive signal SDR so that the phase difference approaches the target phase difference based on the results of the above comparison.

2 Claims, 17 Drawing Sheets

DRIVE APPARATUS OF PIEZOELECTRIC ACTUATOR, ELECTRONIC APPARATUS, DRIVE METHOD OF ELECTRONIC APPARATUS, DRIVE CONTROL PROGRAM OF ELECTRONIC APPARATUS, AND MEDIUM

FIELD OF THE INVENTION

The present invention relates to a piezoelectric actuator apparatus, to an electronic device, to a driving method for the electronic device, to a drive control program for the electronic device, and to a storage medium in which the program is stored.

DESCRIPTION OF THE RELATED ART

Piezoelectric elements have excellent efficiency or response in the conversion from electrical energy to mechanical energy. Various types of piezoelectric actuators have therefore been developed in recent years that utilize the piezoelectric effects of a piezoelectric element.

These piezoelectric actuators have as their primary constituent element a vibrating body having a piezoelectric element, wherein the vibrating body is composed, for example, of a plate-shaped reinforcing plate having a protrusion that contacts a driven body on one end thereof, piezoelectric elements affixed to both sides of the reinforcing plate, drive electrodes provided on the surfaces of these piezoelectric elements, and detection electrodes that are electrically insulated from the drive electrodes. A drive apparatus for a piezoelectric actuator is also known whereby a prescribed alternating current is applied to the drive electrodes of the vibrating body, the vibrating body is excited by longitudinal vibration that causes the vibrating body to expand and contract in the longitudinal direction, and flexural vibration is induced whereby the vibrating body oscillates in the direction orthogonal to the direction of the longitudinal vibration (see Prior Art 1, for example).

With the drive control performed by this type of drive apparatus, a piezoelectric actuator rotates so that the protrusion of the vibrating body traces an elliptical orbit and drives the driven body that is in contact with the protrusion. An alternating current voltage having the optimum oscillation frequency according to design must be applied to the vibrating body of the piezoelectric actuator, and the prescribed longitudinal vibration and flexural vibration must be generated therein in order for the driven body to be driven at high efficiency. However, according to the circuit characteristics or temperature of the drive apparatus, its driving torque, and the like, it is difficult to continually apply the optimum drive frequency that the apparatus is designed for. Feedback control is therefore implemented in this drive apparatus whereby a detection signal from the detection electrodes provided to the piezoelectric elements is detected, and the drive frequency of the alternating current voltage applied to the drive electrodes is adjusted based on the detection signal.

Specifically, it is known that the phase difference between the phase of the alternating current voltage applied to the drive electrodes and the phase of the detection signal detected from the detection electrodes, or the phase difference among the detection signals detected from a plurality of detection electrodes, is dependent upon the drive frequency of the alternating current voltage applied to the drive electrodes. The aforementioned phase difference corresponding to the optimum drive frequency for which the piezoelectric actuator was designed is therefore set in advance as the target phase difference, and the drive frequency of the alternating current voltage applied to the drive electrodes is adjusted so that the detected phase difference approaches the target phase difference set in advance. By implementing this type of feedback control, it becomes possible to apply an alternating current voltage having the optimum drive frequency for the vibrating body of the piezoelectric actuator, to cause the piezoelectric actuator to excite with the prescribed longitudinal and flexural vibration, and to drive the driven body at high efficiency.

[Prior Art 1]: Japanese Unexamined Patent Application Publication No. 2002-291264

SUMMARY OF THE INVENTION

However, it has been learned as a result of concentrated investigation by the applicant that the frequency characteristics detected from the detection electrodes that indicate the vibration state of the vibrating body are dependent upon the drive voltage, so even when the drive frequency is feedback-controlled in the drive apparatus of Prior Art 1 in a manner such that the phase difference between the phase of the drive voltage and the phase of the detection signal approaches the target phase difference set in advance, it may not be possible to apply the optimum drive frequency to the vibrating body of the piezoelectric actuator. Specifically, with the conventional feedback control, the frequency characteristics of the vibrating body also fluctuate depending on the drive voltage when the drive voltage fluctuates, making it impossible to perform optimal control even when the drive frequency is adjusted based on the pre-set target phase difference. The conventional system therefore has drawbacks in that the range of drive voltages that can be applied by the piezoelectric actuator is limited, and the drive efficiency is severely reduced when a drive voltage is applied that is outside a specific voltage range.

An object of the present invention is to provide a piezoelectric actuator drive apparatus capable of adapting to a wide range of drive voltages whereby high-efficiency driving of the piezoelectric actuator can be reliably performed, and also to provide an electronic device, a driving method thereof, a drive control program thereof, and a storage medium in which the program is stored.

The drive apparatus for a piezoelectric actuator of the present invention is a piezoelectric actuator drive apparatus for driving a piezoelectric actuator having a vibrating body that vibrates due to the application of a drive signal having a prescribed drive frequency to a piezoelectric element, and as a main feature thereof, comprises driving means for supplying the drive signal to the piezoelectric element of the vibrating body; vibration state detection means for detecting a value that indicates the vibration state of the vibrating body; target value setting means for setting the target value to be the target for the vibration state; correction means for correcting at least one of the value indicating the vibration state and the target value based on at least one of the power source voltage, the drive voltage of the piezoelectric actuator, and the voltage value of the value indicating the vibration state; comparison means for comparing the value indicating the vibration state with the target value; and control means for modifying the drive frequency of the drive signal so that the value indicating the vibration state approaches the target value based on the results of comparison by the comparison means.

By the present invention thus configured, at least one of the value indicating the vibration state of the vibrating body and the target value of the vibration state is corrected, and the drive frequency of the drive signal is changed based on this corrected result, whereby the relationship between the vibration state and the target value can be appropriately adjusted, the optimum drive frequency can be applied, and high-efficiency driving can be performed, even in such a case as when the vibration state of the vibrating body strays from the target value according to the drive voltage. It also becomes possible to adapt to a wide range of drive voltages using only a few types of piezoelectric actuators without the need for preparing numerous piezoelectric actuators according to drive voltages. Furthermore, when the power source voltage decreases or fluctuates due to usage conditions, usage time, and other factors, feedback control can be performed that circumvents the effects of this voltage fluctuation, and the appropriate level of drive efficiency of the piezoelectric actuator can be continually maintained.

The correction means may correct the value indicating the detected vibration state, may correct the target value for the vibration state, and may correct both of these values. The correction means may perform correction based on the preset correction value for the piezoelectric actuator, and this correction value may be set based on the drive voltage dependency as found by measurement, calculation, or the like.

Since correction by the correction means is based on at least one of the power source voltage, the piezoelectric actuator drive voltage, and the voltage value of the value indicating the vibration state, the value indicating the vibration state or the target value can be immediately changed according to variation of the drive voltage. Control can be performed quickly and reliably from this perspective as well. It is assumed that variation of the drive voltage is detected by direct detection of the drive voltage at this time, but since the voltage value of the value indicating the vibration state corresponds to the drive voltage, variation of the drive voltage can be detected in the same manner even if a configuration is adopted whereby the aforementioned voltage value is detected.

In this regard, the vibration state detection means in the piezoelectric actuator drive apparatus of the present invention is preferably a phase difference detection means for detecting the phase difference between the detection signals that indicate the drive signal and the vibration state of the vibrating body, or the phase difference among a plurality of detection signals that indicate the vibration state of the vibrating body, wherein the target value setting means sets the target phase difference to be the target for the phase difference; the correction means has a voltage detection means for detecting at least one of the power source voltage, the drive voltage of the piezoelectric actuator, and the voltage value of the detection signal, and a phase difference modifying means for modifying the target phase difference based on the voltage value detected by the voltage detection means; and the comparison means compares the phase difference with the modified target phase difference.

By this configuration, the drive frequency can be modified quickly since the phase difference between the drive signal and the detection signal indicating the vibration state of the vibrating body, or the phase difference among a plurality of detection signals from a plurality of detection electrodes provided to the vibrating body, is detected, the target phase difference that is the target value for this phase difference is corrected, and feedback control is performed based on the comparison between the corrected target phase difference and the phase difference. Specifically, as described above, it is known that the phase difference between the drive signal and the detection signal (or between detection signals) is dependent upon the drive frequency of the drive voltage, and this dependency is such that the phase difference decreases monotonically with respect to an increase in the drive frequency, or, in other words, this dependency is such that no peak occurs in the phase difference. Therefore, whether to increase or decrease the drive frequency can be immediately determined from the size difference between the phase difference detected by the phase difference detection means and the target phase difference, and control can be performed more rapidly. In this regard, the value by which the target phase difference is modified may be a discrete value set for each prescribed range of the voltage value, or may be the value of a function set in continuous fashion with respect to the voltage value.

A configuration may also be adopted in the piezoelectric actuator drive apparatus of the present invention whereby the vibration state detection means is a phase difference detection means for detecting the phase difference between the drive signal and the detection signal indicating the vibration state of the vibrating body, or the phase difference among a plurality of detection signals that indicate the vibration state of the vibrating body; the target value setting means sets the target phase difference to be the target for the phase difference; the correction means has a voltage detection means for detecting at least one of the power source voltage, the drive voltage of the piezoelectric actuator, and the voltage value of the detection signal, and also has a phase difference shifting means for shifting the phase difference based on the voltage value detected by the voltage detection means; and the comparison means compares the shifted phase difference with the target phase difference.

By this type of configuration, the phase difference between the drive signal and the detection signal indicating the vibration state of the vibrating body, or the phase difference among a plurality of detection signals from a plurality of detection electrodes provided to the vibrating body, is detected, this phase difference is corrected, and feedback control is performed based on the comparison between the corrected phase difference and the target phase difference, making it possible to quickly modify the drive frequency for the same reason as described above. In this regard, the value by which the phase difference is modified may be a discrete value set for each prescribed range of the voltage value, or may be the value of a function set in continuous fashion with respect to the voltage value.

A configuration may also be adopted in the piezoelectric actuator drive apparatus of the present invention whereby the correction means has a phase shifting means for shifting the phase of the detection signal based on at least one of the power source voltage, the drive voltage of the piezoelectric actuator, and the voltage value of the detection signal indicating the vibration state of the vibrating body; the vibration state detection means is a phase difference detection means for detecting the phase difference between the drive signal and the phase-shifted detection signal; the target value setting means sets the target phase difference to be the target phase difference; and the comparison means compares the phase difference with the target phase difference.

By this type of configuration, the drive frequency can be quickly modified since the phase of the detection signal is shifted based on at least one of the power source voltage, the drive voltage of the piezoelectric actuator, and the voltage value of the detection signal indicating the vibration state of the vibrating body, and feedback control is performed based on the comparison between the phase difference between this shifted detection signal and the drive signal, and the target phase difference. Specifically, whether to increase or decrease the drive frequency can be immediately determined from the size difference between the phase difference detected by the phase difference detection means and the target phase difference, and control can be performed more rapidly, the same as in the aforementioned case in which the phase difference or the target phase difference is modified. The phase of the detection signal can also be immediately shifted according to the variation of the drive voltage, and control can be performed quickly and reliably from this perspective as well.

In this regard, the phase shifting means is preferably composed of a nonlinear element in the piezoelectric actuator drive apparatus of the present invention.

The nonlinear element may also be composed of a diode or an off-state transistor.

Furthermore, when the nonlinear element is composed of a diode, the diode may be composed of a parasitic diode of a MOS transistor.

By this type of configuration, the phase of the detection signal can be shifted by a simple circuit structure since the phase shifting means is formed from a common diode, a parasitic diode of a MOS transistor, an off-state transistor, or other nonlinear element. Specifically, the phase of the detection signal is shifted by the nonlinear element as a result of the fact that the voltage value and the current value of the detection signal are no longer proportional to each other. By using a diode, parasitic diode of a MOS transistor, off-state transistor, or the like, the phase shifting means can be formed at low cost.

The nonlinear element is not limited to the examples mentioned above, and an element whereby the size of the current is modified in nonlinear fashion with respect to the size of the applied voltage, a circuit in which this type of element is combined with a capacitor or the like, or another element may be used.

In the piezoelectric actuator drive apparatus of the present invention described above, the phase difference detection means is preferably provided with a waveform shaping circuit for shaping the waveforms of the drive signal and the detection signal, or with a phase difference voltage conversion circuit for detecting the phase difference of the signals thus shaped, and converting the phase difference thus detected to a voltage.

By this type of configuration, since the phase difference between the signals that include the drive signal and the detection signal is outputted as a voltage value from the phase difference voltage conversion circuit, the comparison means can be formed using a comparator or other simple and inexpensive device if the target phase difference that is compared with the voltage value of the phase difference is also set as a voltage value.

A configuration may also be adopted whereby the vibration state detection means in the piezoelectric actuator drive apparatus of the present invention is a voltage detection means for detecting the voltage of the detection signal indicating the vibration state of the vibrating body; the target value setting means sets the target voltage to be the target voltage of the detection signal; the correction means has a voltage modifying means for modifying at least one of the voltage of the detection signal and the target voltage based on at least one of the power source voltage and the drive voltage of the piezoelectric actuator; and the comparison means compares the voltage of the detection signal with target voltage.

Furthermore, a configuration may be adopted whereby the vibration state detection means is a current detection means for detecting the current of the detection signal indicating the vibration state of the vibrating body; the target value setting means sets the target current to be the target current of the detection signal; the correction means has a current modifying means for modifying at least one of the current of the detection signal and the target current based on at least one of the power source voltage, the drive voltage of the piezoelectric actuator, and the voltage value of the detection signal; and the comparison means compares the current of the detection signal with the target current.

A configuration may also be adopted whereby the vibration state detection means is a current detection means for detecting the current of the drive signal; the target value setting means sets the target current to be the target current of the drive signal; the correction means has a current modifying means for modifying at least one of the current of the drive signal and the target current based on at least one of the power source voltage, the drive voltage of the piezoelectric actuator, and the voltage value of the detection signal; and the comparison means compares the current of the detection signal with the target current.

By these configurations, at least one of the voltage or current of the detection signal indicating the vibration state of the vibrating body and the target voltage or target current, or at least one of the current of the drive signal or the target current, is corrected, both are compared, and the drive frequency of the drive signal is modified based on the results of this comparison, so even if the voltage or current of the detection signal strays from the target voltage or target current according to the drive voltage, or if the current of the drive signal strays from the target current, this deviance can be corrected, the optimum drive frequency can be applied, and high-efficiency driving can be performed.

In the piezoelectric actuator drive apparatus of the present invention described above, it is preferred that the comparison means be provided with a computation means for computing the results of comparing the value indicating the vibration state of the vibrating body with the target value, and that the control means modify the drive frequency of the drive signal based on the computed information computed by the computation means.

By this type of configuration, since the comparison results are computed by the computation means, and the computed information is outputted to the control means, control is performed based on at least two or more comparison results thus computed, rather than on one comparison result. The precision and efficiency of feedback control are thus not easily affected by fluctuation in the detection signal or drive voltage, and can thus be enhanced. In this regard, an integration circuit provided with an up-down counter, for example, can be used as an integrating means.

A feature of the electronic device of the present invention is that it is provided with any of the aforementioned drive apparatuses for a piezoelectric actuator, a piezoelectric actuator driven by the same, and a power source.

By the present invention thus configured, as previously mentioned, even in such a case as when the vibration state of the vibrating body deviates from the target value according to the drive voltage, the relationship between the vibration state and the target value thereof can be appropriately corrected, the optimum drive frequency can be applied, and an electronic device can be obtained that enables high-efficiency driving.

The driving method for the electronic device of the present invention is an electronic device driving method for driving an electronic device provided with a piezoelectric actuator having a vibrating body that vibrates due to the application of a drive signal having a prescribed drive frequency to a piezoelectric element; driving means for supplying the drive signal to the piezoelectric element of the vibrating body; and a power source; wherein the driving method comprises a vibration state detection step for detecting the value indicating the vibration state of the vibrating body; a target value setting step for setting a target value to be the target for the vibration state; a correction step for correcting at least one of the value indicating the vibration state and the target value based on at least one of the power source voltage, the drive voltage of the piezoelectric actuator, and the voltage value of the value indicating the vibration state; a comparison step for comparing the value indicating the vibration state with the target value; and a control step for modifying the drive frequency of the drive signal based on the results of comparison in the comparison step so that the value indicating the vibration state approaches the target value.

Furthermore, a driving method for driving an electronic device provided with a piezoelectric actuator having a vibrating body that vibrates due to the application of a drive signal having a prescribed drive frequency to a piezoelectric element using driving means for supplying the drive signal to the piezoelectric element of the vibrating body may also be employed as the piezoelectric actuator driving method; wherein the driving method comprises a vibration state detection step for detecting the value indicating the vibration state of the vibrating body; a target value setting step for setting a target value to be the target for the vibration state; a correction step for correcting at least one of the value indicating the vibration state and the target value based on at least one of the power source voltage, the drive voltage of the piezoelectric actuator, and the voltage value of the value indicating the vibration state; a comparison step for comparing the value indicating the vibration state with the target value; and a control step for modifying the drive frequency of the drive signal based on the results of comparison in the comparison step so that the value indicating the vibration state approaches the target value.

By the present invention having this type of configuration, as previously mentioned, the relationship between the vibration state and the target value can be appropriately adjusted, the optimum drive frequency can be applied, and high-efficiency driving can be performed, even in such a case as when the vibration state of the vibrating body strays from the target value according to the drive voltage. It also becomes possible to adapt to a wide range of drive voltages using only a few types of piezoelectric actuators, and even when the power source voltage decreases or fluctuates, the appropriate level of drive efficiency of the piezoelectric actuator can be continually maintained.

The drive control program for the electronic device of the present invention is an electronic device drive control program that performs drive control of an electronic device provided with a piezoelectric actuator having a vibrating body that vibrates due to the application of a drive signal having a prescribed drive frequency to a piezoelectric element, and further provided with a drive apparatus having driving means for supplying the drive signal to the piezoelectric element of the vibrating body, and a power source, and that causes a computer to function as at least one of driving means for supplying the drive signal to the piezoelectric element of the vibrating body; vibration state detection means for detecting a value that indicates the vibration state of the vibrating body; target value setting means for setting the target value to be the target for the vibration state; correction means for correcting at least one of the value indicating the vibration state and the target value based on at least one of the power source voltage, the drive voltage of the piezoelectric actuator, and the voltage value of the value indicating the vibration state; comparison means for comparing the value indicating the vibration state with the target value; and control means for modifying the drive frequency of the drive signal so that the value indicating the vibration state approaches the target value based on the results of comparison by the comparison means.

Furthermore, a piezoelectric actuator drive control program for performing drive control of a piezoelectric actuator having a vibrating body that vibrates due to the application of a drive signal having a prescribed drive frequency to a piezoelectric element may be employed as the drive control program for the piezoelectric actuator; wherein the program causes a computer to function as at least one of driving means for supplying the drive signal to the piezoelectric element of the vibrating body; vibration state detection means for detecting a value that indicates the vibration state of the vibrating body; target value setting means for setting the target value to be the target for the vibration state; correction means for correcting at least one of the value indicating the vibration state and the target value based on at least one of the power source voltage, the drive voltage of the piezoelectric actuator, and the voltage value of the value indicating the vibration state; comparison means for comparing the value indicating the vibration state with the target value; and control means for modifying the drive frequency of the drive signal so that the value indicating the vibration state approaches the target value based on the results of comparison by the comparison means.

By the present invention thus configured, since a computer functions as some or all of the drive control means for the electronic device, the optimum drive frequency can be applied, driving can be performed with high efficiency, and a wide range of drive voltages can be adapted to by one piezoelectric actuator, as previously mentioned.

The recording medium of the present invention is preferably one in which the electronic device drive control program or the piezoelectric actuator drive control program is recorded in a form that is readable by a computer.

By this type of configuration, the program can easily be read by a computer and updated even when the drive control program for the piezoelectric actuator or electronic device is modified or upgraded.

EFFECT OF THE INVENTION

With the present invention described above, it is possible to provide a piezoelectric actuator drive apparatus capable of adapting to a wide range of drive voltages whereby high-efficiency driving of the piezoelectric actuator can be reliably performed, and also to provide an electronic device, a driving method thereof, a drive control program thereof, and a storage medium in which the program is stored.

KEY TO SYMBOLS

1: electronic watch (electronic device); 12: vibrating body; 60: power source; 100, 200, 300, 400, 500, 600: drive control apparatus; 111, 211, 311, 411, 511, 611: drive circuit (driving means); 120, 220, 320: phase difference detection means (driving means); 121, 221, 321: waveform shaping circuit; 122, 222, 322: phase difference/DC conversion circuit (phase difference voltage conversion circuit); 130, 230, 430, 530, 630: correcting means; 131, 231, 431, 531, 631: power source voltage detection circuit (voltage detection means); 133: comparison voltage setting circuit (phase difference modifying means); 140, 240, 340, 440, 540, 640: drive frequency setting means (comparing means); 142, 242, 342, 442, 542, 642: integration circuit (integrating means); 233: phase difference shifting circuit; 250, 350, 433, 533, 633: comparison voltage setting circuit (target value setting means); 330: phase shifting means; 331, 332: diode; 333: capacitor; 334: MOS transistor; 334A: parasitic diode; 420: peak-hold circuit (voltage detection means); 520, 620: current detection means; A: piezoelectric actuator; SD1: detection signal; SDR: drive signal.

DESCRIPTION OF THE PREFERRED EMBODIMENTS

Embodiments of the present invention will be described hereinafter with reference to the drawings. As is clear from the disclosure of the present invention to one skilled in the art, the description relating to working examples of the present invention is given only for the purpose of describing the present invention, and shall not be construed as limiting the present invention as defined within the scope of the claims described hereinafter, or within an equivalent range.

1. First Embodiment

A first embodiment of the present invention will be described hereinafter based on the drawings.

The same symbols are used below from the description of the second embodiment onward to refer to components that are the same as those described in the first embodiment below, and for components that have the same functions as those in the first embodiment, and description thereof is simplified or omitted.

[1-1. Overall Structure]

Figure 1:
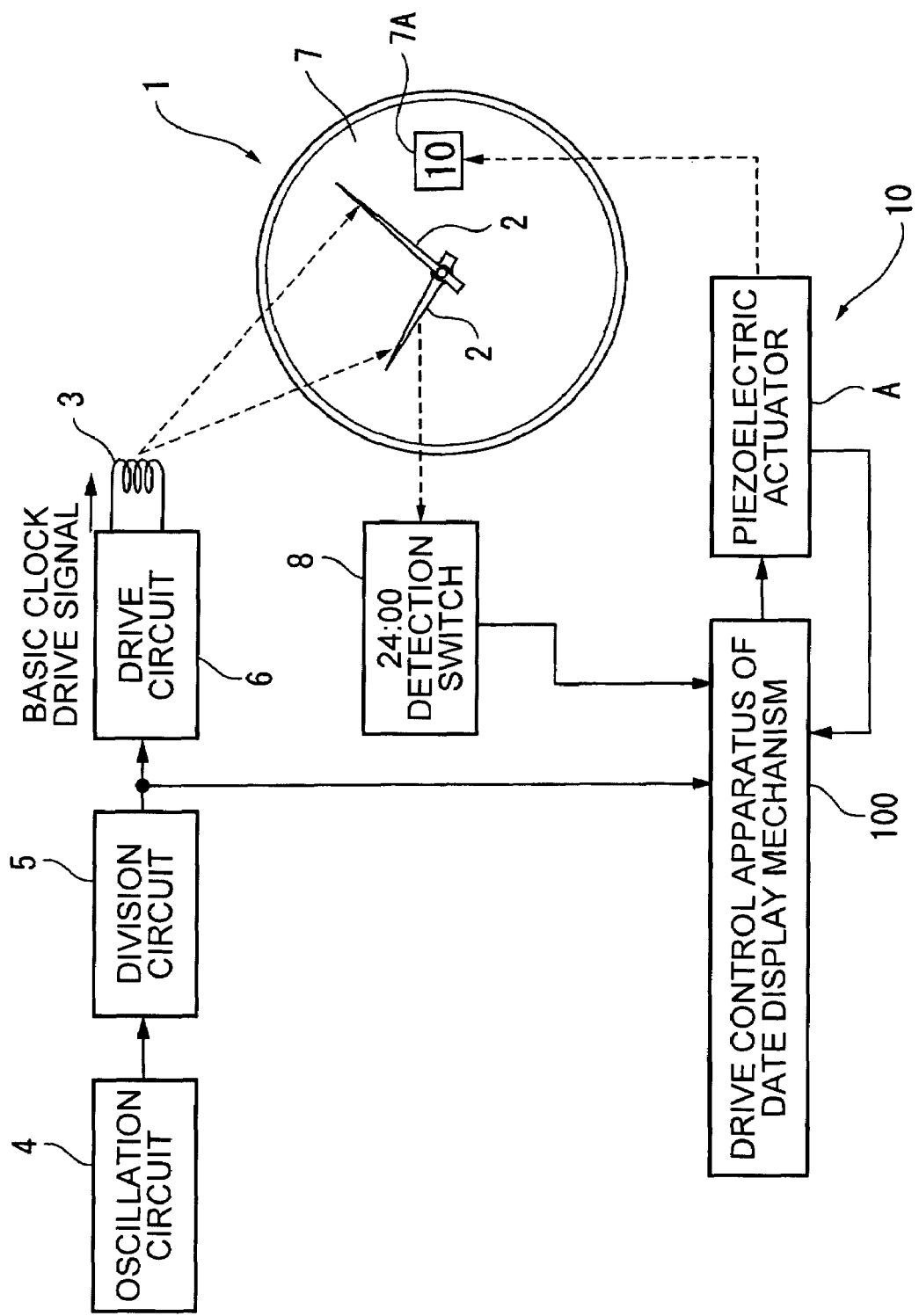
FIG. 1 is a diagram showing a schematic structure of the electronic device according to a first embodiment of the present invention.
Figure 2:
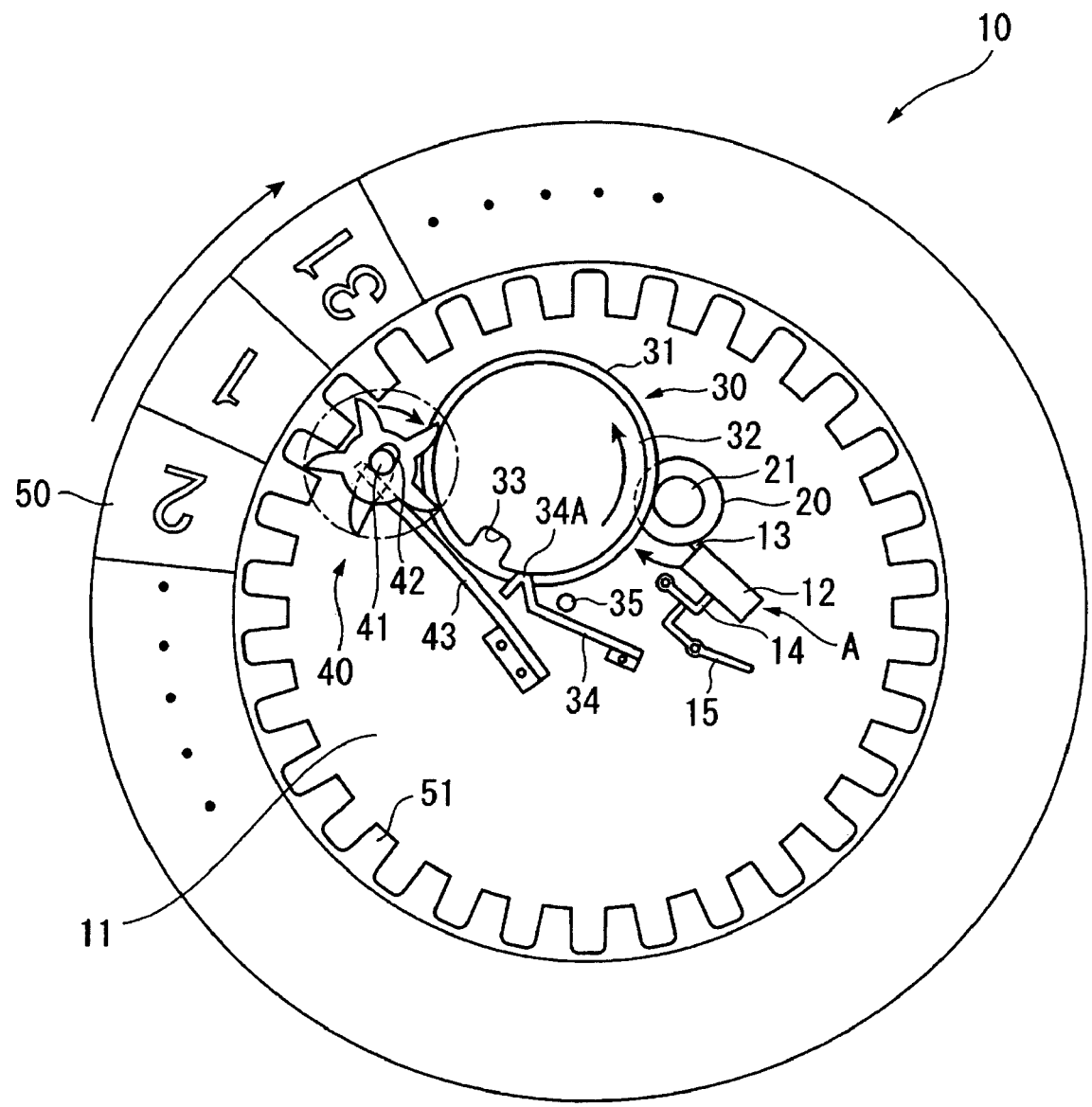
FIG. 2 is a plan view showing the detailed structure of the date display mechanism in the electronic device.

FIG. 1 is a diagram showing the schematic structure of the electronic watch 1 as the electronic device in the present embodiment. FIG. 2 is a plan view showing the detailed structure of the date display mechanism 10 in the electronic watch 1.

As shown in FIG. 1, the electronic watch 1 is a wristwatch provided with a pointer 2 for indicating the time, and a stepping motor 3 for driving the pointer 2. The driving of the stepping motor 3 is controlled by an oscillation circuit 4, a division circuit 5, and a drive circuit 6. The oscillation circuit 4 has a reference oscillation source composed of a quartz oscillator, and outputs a reference pulse. The reference pulse outputted from the oscillation circuit 4 is inputted to the division circuit 5, which generates a reference signal (a signal of 1 Hz, for example) based on the reference pulse. The drive circuit 6 generates a motor drive pulse for driving the stepping motor 3 based on the reference signal outputted from the division circuit 5.

The date display mechanism 10 of the electronic watch 1 is provided with a piezoelectric actuator A and a drive control apparatus 100 for performing drive control of the piezoelectric actuator A. This drive control apparatus 100 is configured so as to detect the time (24:00, for example) of the electronic watch 1, operate a switch 8 for opening and closing as a trigger, and drive the date display mechanism 10.

As shown in FIG. 2, the date display mechanism 10 is basically composed of the principal components that include the piezoelectric actuator A, a rotor 20 as an object rotationally driven by the piezoelectric actuator A, a reduction train wheel for transmitting while reducing the speed of rotation of the rotor 20, and a date indicator 50 rotated by the drive force transmitted via the reduction train wheel. The reduction train wheel is provided with an intermediate date wheel 30 and a date indicator driving wheel 40. The piezoelectric actuator A, the rotor 20, the intermediate date wheel 30, and the date indicator driving wheel 40 are supported by the bottom plate 11. The piezoelectric actuator A has a flat, strip-shaped vibrating body 12, and this vibrating body 12 is positioned so that the distal end thereof is in contact with the external peripheral surface of the rotor 20. A disk-shaped dial 7 is provided over the date display mechanism 10, as shown in FIG. 1. A window 7A for displaying the date is provided in a portion of the external periphery of the dial 7, and is configured so that the date on the date indicator 50 can be seen from the window 7A. The movement or other component for driving the pointer 2, connected to the stepping motor 3, is also provided under the bottom plate 11 (on the back side thereof).

The intermediate date wheel 30 is composed of a large-diameter portion 31 and a small-diameter portion 32. The small-diameter portion 32 is a cylinder having a slightly smaller diameter than that of the large-diameter portion 31, and a substantially square notch 33 is formed in the external peripheral surface thereof. The small-diameter portion 32 is fixed so as to share the same center with respect to the large-diameter portion 31. A gear 21 on top of the rotor 20 meshes with the large-diameter portion 31. The intermediate date wheel 30 composed of the large-diameter portion 31 and the small-diameter portion 32 therefore rotates in coupling with the rotation of the rotor 20.

A leaf spring 34 is provided to the bottom plate 11 on the side of the intermediate date wheel 30, the base end of the leaf spring 34 is fixed to the bottom plate 11, and the distal end 34A thereof is folded into a substantial V shape. The distal end 34A of the leaf spring 34 is provided so as to be capable of entering and exiting the notch 33 of the intermediate date wheel 30. A terminal 35 is positioned in the vicinity of the leaf spring 34, and this terminal 35 is configured so as to come in contact with the leaf spring 34 when the distal end 34A of the leaf spring 34 is in the notch 33. A prescribed voltage is applied to the leaf spring 34, and this voltage is applied to the terminal 35 as well when the leaf spring comes in contact with the terminal 35. Therefore, by detecting the voltage of the terminal 35, the passing of a day can be detected, and one day's worth of rotation of the date indicator 50 can be detected. The configuration in which a leaf spring 34 or terminal 35 is used to detect the amount of rotation of the date indicator 50 is not limiting, and a configuration may also be adopted whereby the state of rotation of the rotor 20 or intermediate date wheel 30 is detected and a prescribed pulse signal is outputted, or another configuration. Specifically, publicly known photoreflectors, photointerrupters, MR sensors, and various other types of rotation encoders and the like may be used.

The date indicator 50 has a ring shape, and an annular gear 51 is formed on the internal peripheral surface thereof. The date indicator driving wheel 40 has a five-toothed gear that meshes with the annular gear 51 of the date indicator 50. A shaft 41 is provided at the center of the date indicator driving wheel 40, and this shaft 41 is loosely fitted into a through-hole 42 formed in the bottom plate 11. The through-hole 42 is formed elongated in the circumferential direction of the date indicator 50. The date indicator driving wheel 40 and the shaft 41 are urged towards the upper right direction in FIG. 2 by a leaf spring 43 fixed to the bottom plate 11. The urging of the leaf spring 43 prevents the date indicator 50 from vibrating.

The vibrating body 12 of the piezoelectric actuator A is a rectangular plate having two long sides and two short sides. The vibrating body 12 has a layered structure in which a stainless steel or other reinforcing plate having substantially the same shape as the piezoelectric elements and a thickness that is less than that of the piezoelectric elements is sandwiched between two rectangular plate-shaped piezoelectric elements. Lead zirconate titanate (PZT (registered trademark)), quartz, lithium niobate, barium titanate, lead titanate, lead metaniobate, polyvinylidene fluoride, lead zinc niobate, lead scandium niobate, and various other substances can be used as the piezoelectric element.

The vibrating body 12 has a contacting portion 13 in the substantial center in the width direction of the short side. This contacting portion 13 is obtained by cutting and molding the reinforcing plate, or by another method, and the distal end portion thereof having a gently curved surface is caused to protrude from the piezoelectric element. The vibrating body 12 maintains a position wherein the distal end of the contacting portion 13 is brought into contact with the external peripheral surface of the rotor 20. A supporting member 14 and an urging member 15 are provided to the piezoelectric actuator A in order to keep the vibrating body 12 in this type of position.

The supporting member 14 of the piezoelectric actuator A is formed in integral fashion with the reinforcing plate by cutting and molding the reinforcing plate, or another method. This supporting member 14 is an L-shaped member composed of a perpendicular portion that protrudes perpendicularly from the substantial center of the long side of the vibrating body 12, and a horizontal portion that extends parallel towards the rotor 20 from the distal end of the perpendicular portion to the long side. A pin protruding from the bottom plate 11 is passed through the end of the horizontal portion on the other side from the perpendicular portion, and the supporting member 14 and the vibrating body 12 fixed thereto can rotate about the axis of this pin. One end of the urging member 15 is engaged in the substantial center of the horizontal portion of the supporting member 14. A pin protruding from the bottom plate 11 is passed through the substantial center portion of the urging member 15, and the urging member is able to rotate about the axis of the pin. The end of the urging member 15 on the opposite side from the supporting member 14 is engaged with the bottom plate 11, and the pressure with which the contacting portion 13 of the vibrating body 12 is pressed against the external peripheral surface of the rotor 20 can be adjusted by changing the position of the end of the urging member.

In the above configuration, the vibrating body 12 of the piezoelectric actuator A operates such that longitudinal vibration as a first vibration mode and flexural vibration as a second vibration mode induced by the longitudinal vibration are generated by a drive signal having a specific frequency being applied to the piezoelectric element from the drive control apparatus 100, and the contacting portion 13 traces an elliptical orbit in the plane that includes the plate surface. The external peripheral surface of the rotor 20 is struck by the contacting portion 13 of the vibrating body 12, and is driven around in the clockwise direction as indicated by the arrow in FIG. 2. The rotation of the rotor 20 is transmitted to the date indicator driving wheel 40 via the intermediate date wheel 30, and the date indicator driving wheel 40 rotates the date indicator 50 in the clockwise direction. These transfers of power from the vibrating body 12 to the rotor 20, from the rotor 20 to the reduction train wheel (intermediate date wheel 30 and date indicator driving wheel 40), and from the reduction train wheel to the date indicator 50 are all transfers of power in the direction parallel to the surface of the bottom plate 11 of the vibrating body 12. Therefore, rather than a coil or rotor being stacked in the thickness direction as in a stepping motor, the vibrating body 12 and the rotor 20 are disposed in the same plane, and the date display mechanism 10 can be made thinner. Since the date display mechanism 10 can be made thinner, the electronic watch 1 as a whole can be made thinner.

[1-2. Structure of the Drive Control Apparatus of the Piezoelectric Actuator A]

The relationship between the vibration state of the vibrating body 12 and the drive voltage of the drive voltage signal SDR will first be described based on FIG. 3 before description of the structure of the drive control apparatus 100.

Figure 3:
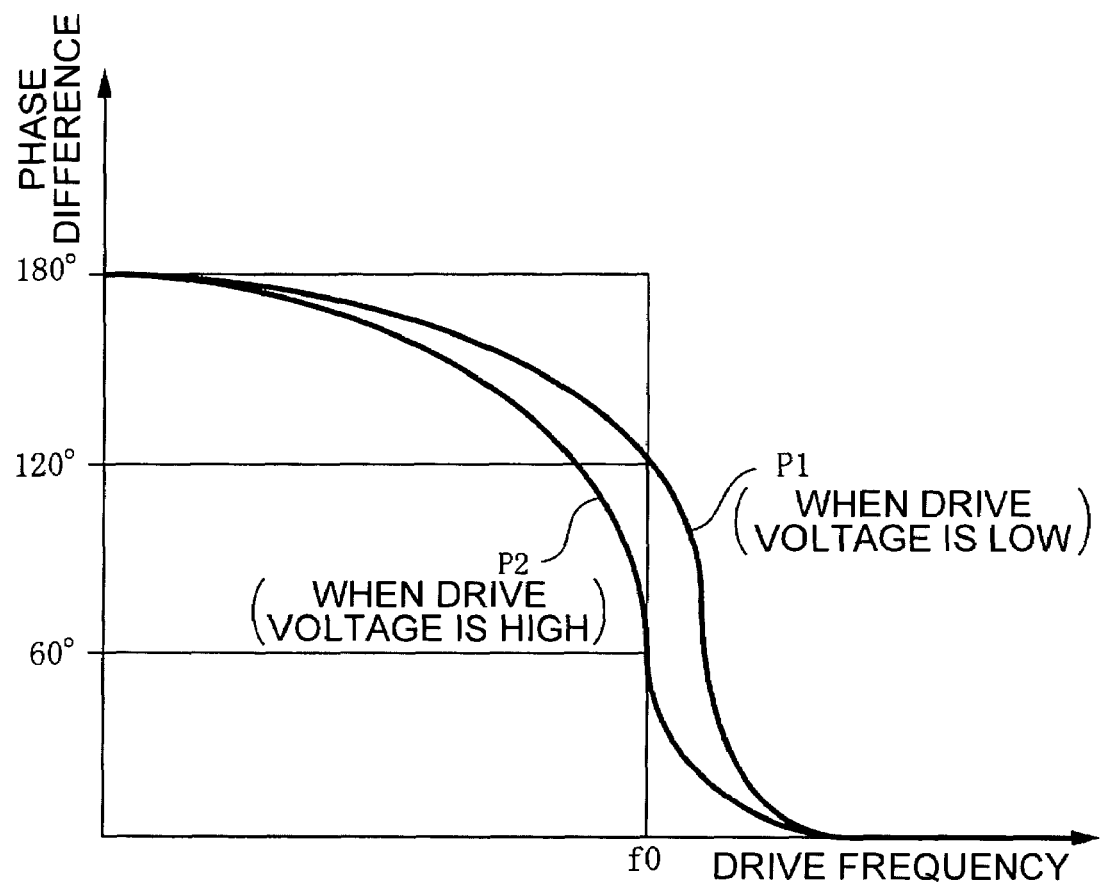
FIG. 3 is a diagram showing the vibration state in the piezoelectric actuator.

FIG. 3 is a diagram showing the relationship of the phase difference (value indicating the vibration state) between the detection signal SD1 from the vibrating body 12 and the drive voltage signal SDR with respect to the drive frequency of the drive voltage signal SDR. In this arrangement, the detection signal SD1 is the signal obtained from the vibration detection electrode T1 (FIG. 4) positioned at the piezoelectric element of the vibrating body 12, and this signal indicates the vibration of the vibrating body 12. In the same diagram, the curve P1 that is the upper of the two curves indicates the relationship of the phase difference to the drive frequency when the drive voltage is comparatively low (1 V, for example), and the lower curve P2 indicates the relationship of the phase difference to the drive frequency when the drive voltage is comparatively high (2 V, for example). In the same diagram, f0 indicates the optimum drive frequency of the piezoelectric actuator A, the phase difference at the optimum drive frequency f0 (300 kHz, for example) in curve P1 is approximately 120°, and the phase difference at the optimum drive frequency f0 in curve P2 is approximately 60°.

As described above, the phase difference between the detection signal SD1 and the drive voltage signal SDR, specifically, the vibration state of the vibrating body 12, depends on the size of the drive voltage, and the phase difference at the optimum drive frequency f0 ultimately varies according to the size of the drive voltage. Specifically, assuming a case in which the drive voltage is comparatively low (the case of P1 in the diagram), even when the target phase difference at the optimum drive frequency f0 is set to 120°, if the drive voltage becomes high (the case of P2 in the diagram), the drive frequency at the target phase difference (120°) deviates towards being smaller than the optimum drive frequency f0. Therefore, it is apparent from FIG. 3 that the optimum vibration state of the vibrating body 12 is not obtained even when drive control of the piezoelectric actuator A is performed using this target phase difference as a reference.

The drive control apparatus of the present embodiment will next be described based on FIG. 4.

Figure 4:
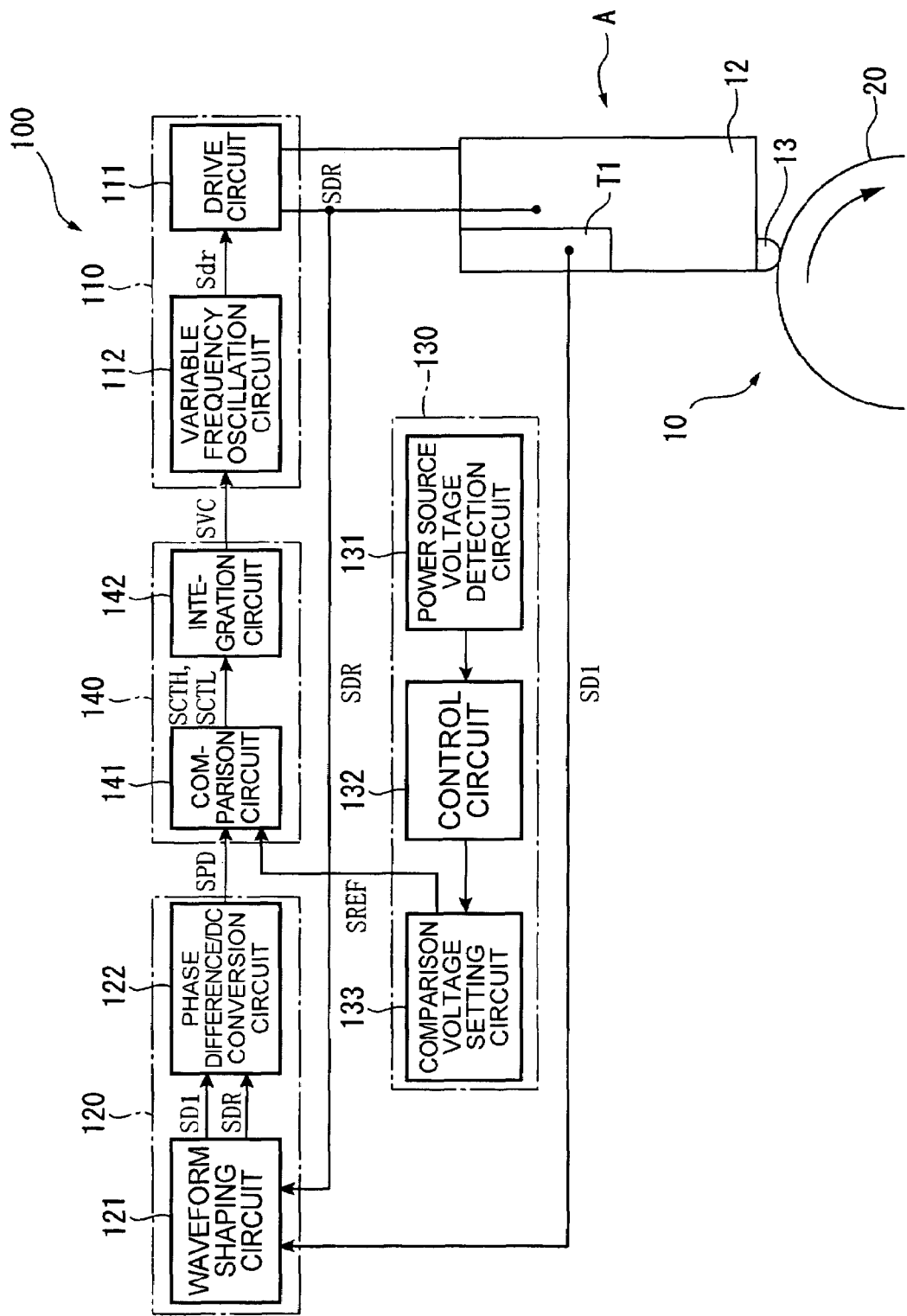
FIG. 4 is a block diagram showing the drive control apparatus for a piezoelectric actuator.

FIG. 4 is a block diagram showing the drive control apparatus 100 of the present embodiment.

In FIG. 4, the drive control apparatus 100 for performing drive control of the piezoelectric actuator A is designed in view of the drive voltage dependency of the vibration state of the vibrating body 12 described above, and is mounted as a circuit on an IC chip. Specifically, this drive control apparatus 100 controls the drive frequency in addition to correcting the target phase difference so that the relation of the phase difference between the detection signal SD1 and the drive voltage signal SDR to the target phase difference becomes the optimum drive frequency f0 according to the drive voltage of the drive voltage signal SDR. The drive control apparatus 100 is also provided with a drive signal supplying means 110, a phase difference detection means 120, a correction means 130 for correcting the target phase difference, and a drive frequency setting means 140 as a comparison means.

The drive signal supplying means 110 applies a drive voltage signal SDR having a prescribed drive frequency to the drive electrode of the vibrating body 12 based on the results of comparison in the drive frequency setting means 140. This drive signal supplying means 110 is provided with a drive circuit 111 as a driving means, and a variable frequency oscillation circuit 112.

The drive circuit 111 is electrically connected to the drive electrode of the vibrating body 12, and is a circuit for amplifying the output signal Sdr from the variable frequency oscillation circuit 112 and applying the drive voltage signal SDR to the drive electrode of the vibrating body 12.

The variable frequency oscillation circuit 112 is a circuit for oscillating at a frequency according to the frequency control voltage signal SVC outputted from the drive frequency setting means 140 and outputting the signal Sdr to the drive circuit 111. In the present embodiment, the oscillation frequency of the variable frequency oscillation circuit 112 has a prescribed frequency variation width according to the temperature or the like, for example.

The phase difference detection means 120 detects the drive voltage signal SDR outputted from the drive circuit 111 to the vibrating body 12, and also detects the detection signal SD1 outputted from the vibration detection electrode T1 according to the vibration of the vibrating body 12 as a result of applying the drive voltage signal SDR to the drive electrode of the vibrating body 12, and further detects the phase difference between the drive voltage signal SDR and the detection signal SD1. This phase difference detection means 120 is provided with a waveform shaping circuit 121 and a phase difference/DC conversion circuit 122 as a phase difference voltage conversion circuit.

The waveform shaping circuit 121 is electrically connected to the drive circuit 111 and the vibration detection electrode T1 of the vibrating body 12, and is a circuit for inputting the drive voltage signal SDR outputted from the drive circuit 111 and the detection signal SD1 outputted from the vibration detection electrode T1, shaping the waveforms of the drive voltage signal SDR and detection signal SD1, and outputting the drive voltage signal SDR and detection signal SD1 thus shaped to the phase difference/DC conversion circuit 122.

A configuration is adopted in the present embodiment whereby the phase difference between the detection signal SD1 and the drive voltage signal SDR is detected, but this configuration is not limiting, and a configuration may also be adopted whereby a plurality of detection electrodes is provided to the vibrating body 12, and the phase difference of the phase differences among a plurality of detection signals from the plurality of detection electrodes is detected.

The phase difference/DC conversion circuit 122 is a circuit for outputting a signal in accordance with the phase difference of the drive voltage signal SDR and the detection signal SD1 shaped by the waveform shaping circuit 121. This phase difference/DC conversion circuit 122 is provided with a phase difference detecting unit not shown in the diagram, and an average voltage conversion unit. The phase difference detecting unit generates a phase difference signal having a pulse width that corresponds to the phase difference between the drive voltage signal SDR and the detection signal SD1, and outputs this phase difference signal to the average voltage conversion unit. The average voltage conversion unit averages the phase difference signal outputted from the phase difference detection unit and outputs a phase difference signal SPD at a level proportional to the phase difference between the drive voltage signal SDR and the detection signal SD1 to the drive frequency setting means 140.

The correction means 130 is a circuit for setting the target phase difference according to the drive voltage, and outputting a reference voltage signal SREF corresponding to the target phase difference to the drive frequency setting means 140; specifically, for modifying the target phase difference according to the variance of the phase difference when the phase difference between the detection signal SD1 and the drive voltage signal SDR varies depending on the drive voltage. This correction means 130 is provided with a power source voltage detection circuit 131 as a voltage detection means for detecting the power source voltage (drive voltage), a control circuit 132 for modifying the target phase difference according to the power source voltage detected by the power source voltage detection circuit 131, and a comparison voltage setting circuit 133 as a phase difference modifying means (target value setting means) for receiving a command from the control circuit 132 and modifying the target phase difference, and outputting a reference voltage signal SREF that corresponds to the target phase difference to the drive frequency setting means 140. The control circuit 132 outputs a control signal that corresponds to the power source voltage detected by the power source voltage detection circuit 131 to the comparison voltage setting circuit 133.

The power source voltage detection circuit 131 is not limited to detecting the power source voltage (drive voltage), and may also be connected to the vibration detection electrode T1 of the vibrating body 12 of the piezoelectric actuator A and configured so as to detect the voltage value of the detection signal SD1 from the vibration detection electrode T1.

The comparison voltage setting circuit 133 is a circuit for outputting a reference voltage signal SREF that corresponds to the prescribed target phase difference to the drive frequency setting means 140 according to the control of the control circuit 132. The comparison voltage setting circuit 133 is provided with an up-down counter not shown in the drawing, and a D/A converter. The up-down counter is configured so as to raise or lower the counter value when an up-count input or down-count input is performed according to the appropriate output from the control circuit 132, and these up- or down-counts are inputted. The up-down counter is configured so as to set the counter value to a prescribed value (a MAX counter value, for example) according to the input of a control signal that is outputted from the control circuit 132 when driving of the piezoelectric actuator A begins. The up-down counter is also composed of a 3-bit counter or the like, and outputs a 3-bit counter value to the D/A converter according to an up-count or a down-count. A reference voltage value corresponding to the counter value of the up-down counter is set within the D/A converter. When the counter value outputted from the up-down counter is inputted, the D/A converter then outputs a reference voltage signal SREF to the drive frequency setting means 140 that corresponds to the reference voltage value in accordance with the counter value.

The drive frequency setting means 140 performs drive control for locking the drive frequency of the drive voltage signal SDR outputted from the drive signal supplying means 110 near the optimum drive frequency f0 according to design so that the difference between the phase difference detected by the phase difference detection means 120 and the target phase difference set by the correction means 130 indicates a value that is near zero. The drive frequency setting means 140 is provided with a comparison circuit 141, an integration circuit 142 (integrating means), and a drive control circuit as a control means not shown in the drawing.

The comparison circuit 141 compares the reference voltage value of the reference voltage signal SREF outputted from the comparison voltage setting circuit 133 with the voltage value of the phase difference signal SPD outputted from the phase difference detection means 120, and outputs comparison information to the integration circuit 142. This comparison circuit 141 is composed of a comparator, for example, and outputs a high-level signal SCTH as comparison information to the integration circuit 142 when the voltage value of the phase difference signal SPD is at or below the reference voltage value of the reference voltage signal SREF. A low-level signal SCTL is also outputted as the comparison information to the integration circuit 142 when the voltage value of the phase difference signal SPD is equal to or greater than the reference voltage value of the reference voltage signal SREF.

The integration circuit 142 integrates the comparison information outputted from the comparison circuit 141, outputs the integrated information to the drive signal supplying means 110, and modifies the drive frequency of the drive voltage signal SDR outputted from the drive signal supplying means 110. This integration circuit 142 is provided with a two AND gates not shown in the diagram, an up-down counter, and a D/A converter. The AND gates input the high-level signal SCTH and low-level signal SCTL outputted from the comparison circuit 141, and the pulse signal outputted from the pulse generation source of the drive control circuit (not shown in the diagram), and output a signal to the up-down counter according to the input timing of the pulse signal. Specifically, when the high-level signal SCTH outputted from the comparison circuit 141 is inputted, the AND gates output a signal to the up-down counter according to the input timing of the pulse signal and perform up-down count input. The AND gates also output a signal to the up-down counter according to the input timing of the pulse signal, and perform down-count input when the high-level signal SCTH outputted from the comparison circuit 141 is inputted therein. The up-down counter is composed of a 12-bit counter or the like, for example, and the counter raises or lowers the counter value according to the signal from the AND gates. This up-down counter is also configured so as to set the counter value to zero by inputting the signal from the drive control circuit to a RESET input terminal. This up-down counter also raises or lowers the counter value and outputs a 12-bit counter value to the D/A converter according to the signal from the AND gates. The frequency control voltage value according to the counter value of the up-down counter is also set in the D/A converter. When the counter value outputted from the up-down counter is inputted to the D/A converter, the D/A converter also presents the variable frequency oscillation circuit 112 of the drive signal supplying means 110 with a frequency control voltage signal SVC that corresponds to the frequency control voltage value in accordance with the counter value.

The drive control circuit of the drive frequency setting means 140 outputs a control command signal as appropriate to the correction means 130 and integration circuit 142 between drive initiation of the piezoelectric actuator A and drive completion thereof, and controls the circuits 130 and 142. This drive control circuit is provided with a pulse generation source not shown in the diagram, a differentiation circuit, and a timer circuit. The pulse generation source is a circuit for outputting a pulse signal at a prescribed frequency from a quartz oscillator, ceramic oscillator, or other reference oscillation signal, for example. This pulse generation source outputs a pulse signal to the two AND gates of the integration circuit 142 and to the timer circuit, for example. The differentiation circuit is a circuit for outputting a pulse signal in synchrony with the input timing of a start signal when a start signal indicating 12:00 AM and the start of driving of the piezoelectric actuator A is inputted thereto from a switch 8; specifically, when a start signal indicating the start of rotation of the date indicator 50 (FIG. 2) is inputted. This differentiation circuit outputs a pulse signal to the up-down counter of the comparison voltage setting circuit 133, the up-down counter of the integration circuit 142, and the timer circuit.

[1-3. Drive Control Method of Piezoelectric Actuator A]

Figure 5:
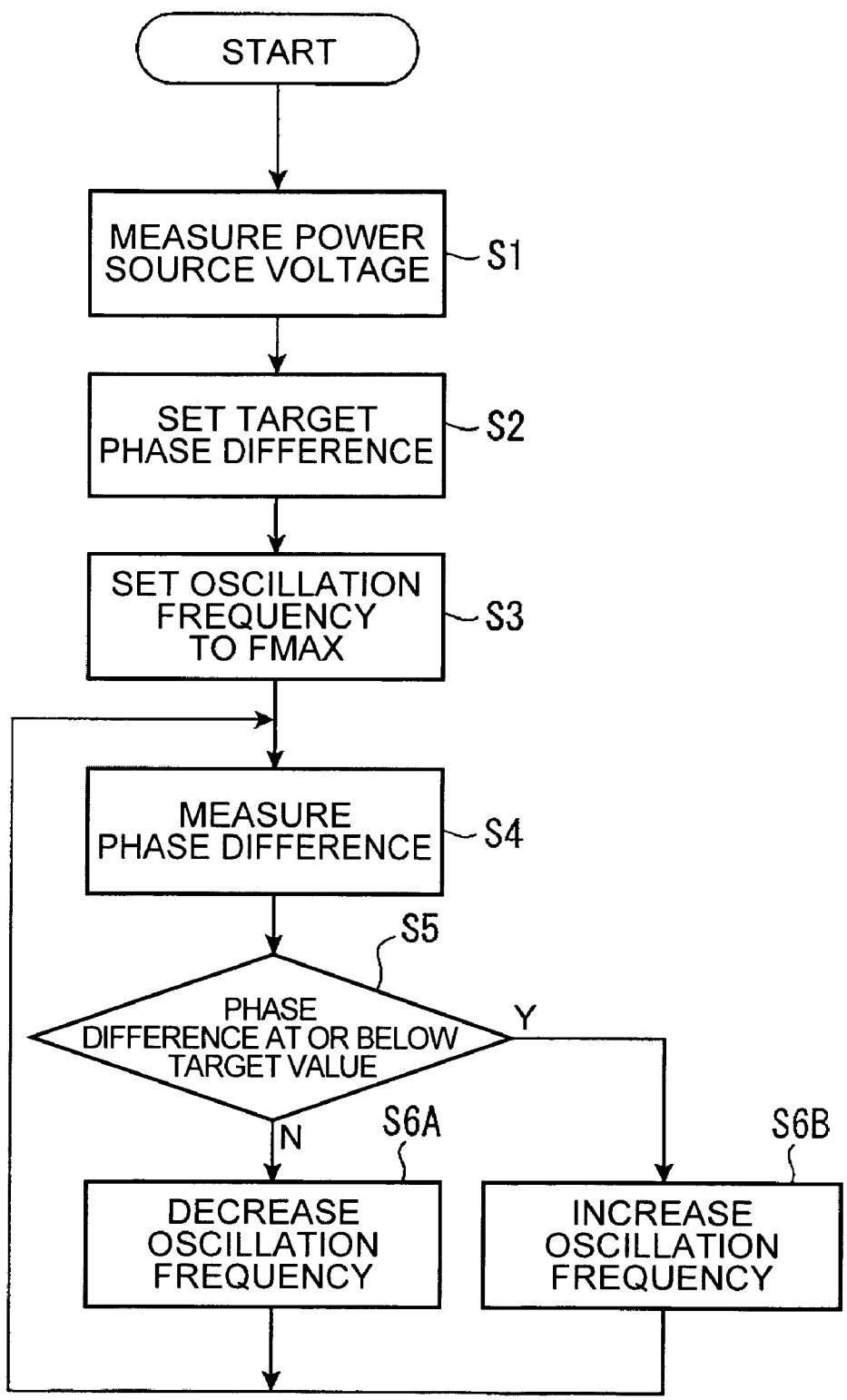
FIG. 5 is a flowchart describing the drive control method of the piezoelectric actuator.

FIG. 5 is a flowchart describing the drive control method of the piezoelectric actuator A.

When the start signal is inputted from the switch 8, the drive control circuit of the drive frequency setting means 140 outputs a control signal to the power source voltage detection circuit 131 of the correction means 130, and causes the power source voltage detection circuit 131 to detect the power source voltage (drive voltage) (step S1).

The control circuit 132 of the correction means 130 outputs a control signal based on the power source voltage thus detected to the comparison voltage setting circuit 133, and causes the comparison voltage setting circuit 133 to set the target phase difference corresponding to the power source voltage (step S2, correcting step, target value setting step). The comparison voltage setting circuit 133 then outputs the reference voltage signal SREF that corresponds to the target phase difference thus set to the drive frequency setting means 140. A configuration is adopted whereby the target phase difference outputted as this reference voltage signal SREF is set to 120°, for example, when the power source voltage is low (in the case of P1 in FIG. 3); specifically, if the power source voltage is 1 V. The difference is set to 60° when the power source voltage is high (the case of P2 in FIG. 3); specifically, if the power source voltage is 2 V.

At the same time as step S1, the drive control circuit of the drive frequency setting means 140 causes a frequency control voltage signal SVC corresponding to a pre-set maximum frequency fmax to be outputted from the integration circuit 142 to the variable frequency oscillation circuit 112 of the drive signal supplying means 110 (step S3).

After step S3, a drive voltage signal SDR having a prescribed drive frequency (the maximum frequency fmax in this case) of a prescribed drive frequency is applied from the drive signal supplying means 110 to the vibrating body 12 of the piezoelectric actuator A, and the vibrating body 12 vibrates. The drive voltage signal SDR is also outputted to the phase difference detection means 120 at this time.

By the vibration of the vibrating body 12, a detection signal SD1 is outputted from the vibration detection electrode T1. The phase difference detection means 120 detects the phase difference between this detection signal SD1 and the drive voltage signal SDR (step S4, vibration state), and outputs a phase difference signal SPD to the comparison circuit 141 of the drive frequency setting means 140.

In the comparison circuit 141, the drive frequency setting means 140 compares the reference voltage value of the reference voltage signal SREF outputted from the comparison voltage setting circuit 133 with the voltage value of the phase difference signal SPD outputted from the phase difference detection means 120 (step S5, comparison step). Specifically, it is determined in the comparison circuit 141 whether the phase difference detected by the phase difference detection means 120 is equal to or less than the target phase difference (120°, 60°).

In step S5, when the comparison circuit 141 determines that the voltage value of the phase difference signal SPD is larger than the reference voltage value of the reference voltage signal SREF ("No"), the signal SCTL is outputted to the integration circuit 142. When the signal SCTL is inputted to the integration circuit 142, the up-down counter counts down, and the counter value decreases by 1. The frequency control voltage value outputted from the integration circuit 142 is thereby reduced, and the drive frequency of the drive voltage signal SDR outputted from the drive signal supplying means 110 is reduced (step S6A, control step).

Since steps S5 and S6A are repeated and the drive frequency of the drive voltage signal SDR is reduced, the drive frequency of the drive voltage signal SDR falls below the optimum drive frequency f0 according to design. At this time, the comparison circuit 141 of the drive frequency setting means 140 determines in step S5 that the voltage value of the phase difference signal SPD is smaller than the reference voltage value of the reference voltage signal SREF, and outputs a signal SCTH to the integration circuit 142.

When the SCTH is inputted to the integration circuit 142, the up-down counter counts up, and the counter value increases by 1. The frequency control voltage value outputted from the integration circuit 142 is thereby increased by a prescribed value, and the drive frequency of the drive voltage signal SDR outputted from the drive signal supplying means 110 is increased by a prescribed value (step S6B, control step).

In the above process, feedback control is executed whereby the drive voltage signal SDR attains a drive frequency that is near the optimum drive frequency f0, and the vibration state of the vibrating body 12 is optimally controlled. This driving of the piezoelectric actuator A is configured such that the rotation rate of the date indicator 50 detected by the terminal 35 of the intermediate date wheel 30 in the date display mechanism 10 is sustained until the date indicator is stopped upon completing a prescribed amount of rotation.

A configuration may also be adopted whereby steps S1, S2, and S5 are repeated following the above steps S6A and S6B. By this configuration, the power source voltage can be continuously detected by the power source voltage detection circuit 131 of the correction means 130 each time the steps are repeated, and the target phase difference can be re-set by the comparison voltage setting circuit 133 based on this detection. Consequently, even when the phase difference deviates from the target phase difference according to variation in the power source voltage, it becomes possible to correct this deviation.

1-4. Effect of First Embodiment

Such effects as the following are obtained by the first embodiment described above.

(1) Specifically, since drive control of the piezoelectric actuator A is performed by feedback control whereby the target phase difference is corrected by the comparison voltage setting circuit 133 of the correction means 130 based on the power source voltage detected by the power source voltage detection circuit 131, the target phase difference thus corrected is compared with the phase difference of the detection signal SD1 and drive voltage signal SDR, and the drive frequency of the drive voltage signal SDR is modified based on the results of this comparison, the relationship between the vibration state and the target value can be appropriately corrected, the optimum drive frequency can be applied, and high-efficiency driving can be performed even in when the vibration state of the vibrating body 12 deviates from the target value depending on the power source voltage.

(2) It also becomes possible to adapt to electronic devices having a wide range of power source voltages using only a few types of piezoelectric actuators A without the need for preparing numerous piezoelectric actuators A according to the power source voltage in an electronic watch 1.

(3) Furthermore, when the power source voltage decreases or fluctuates due to the operating conditions of the electronic watch 1, the time in use, and other factors, drive control can be performed that circumvents the effects of this voltage fluctuation, and the appropriate level of drive efficiency of the piezoelectric actuator A can be continually maintained when a configuration is adopted whereby the power source voltage is detected at the time at which driving of the piezoelectric actuator A is initiated, or during feedback control, and the target phase difference is re-set based thereon.

(4) Since a configuration is adopted whereby feedback control is performed based on comparison of a phase difference that decreases monotonically with respect to an increase in the drive frequency, whether to increase or decrease the drive frequency can be immediately determined in the comparison circuit 141 from the size difference between the phase difference of the detection signal SD1 and drive voltage signal SDR detected by the phase difference detection means 120 and the target phase difference, and drive control can be performed more rapidly.

(5) Since the comparison information outputted from the comparison circuit 141 is integrated by the integration circuit 142 of the drive frequency setting means 140, and the comparison information is outputted to the drive signal supplying means 110, control is performed based on at least two or more comparison results thus integrated, rather than on one comparison result, whereby the precision and efficiency of feedback control are not easily affected by fluctuation in the detection signal SD1, drive voltage, and the like, and can thus be enhanced.

(6) Since the phase difference detection means 120 is provided with the waveform shaping circuit 121 and the phase difference/DC conversion circuit 122, and the phase difference between the drive voltage signal SDR and the detection signal SD1 is outputted from the phase difference/DC conversion circuit 122 as a voltage value, the comparison circuit 141 for comparing the voltage value of this phase difference with the voltage value of the target phase difference can be formed using a comparator or other simple and inexpensive device, and the structure of the drive control apparatus 100 can be simplified.

(7) Since the date display mechanism 10 is driven by the piezoelectric actuator A, high-efficiency driving can be obtained using a small, thin structure, and the electronic watch 1 can be even further miniaturized.

2. Second Embodiment

A second embodiment of the present invention will next be described based on FIG. 6.

Figure 6:
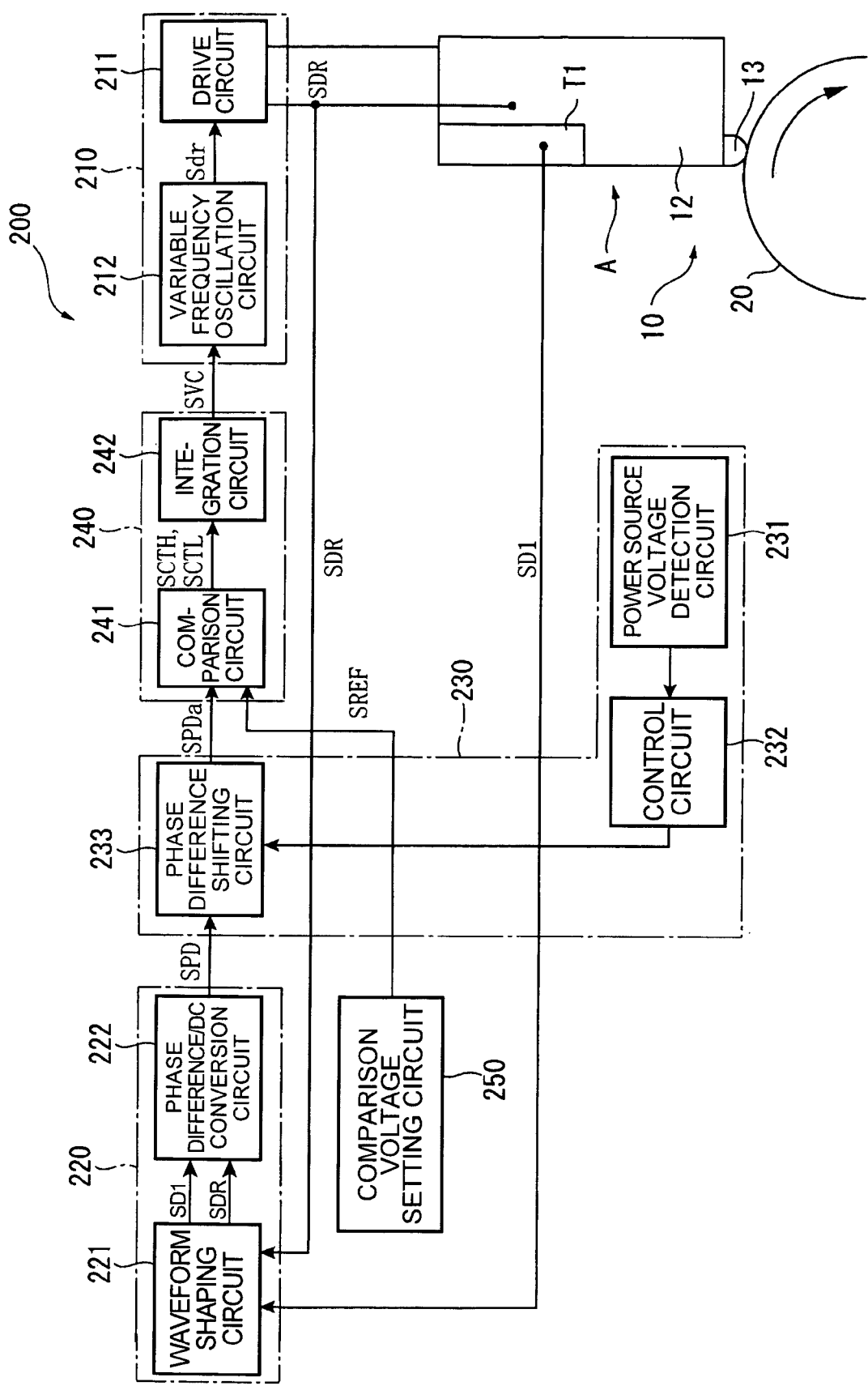
FIG. 6 is a block diagram showing the drive control apparatus for the piezoelectric actuator according to a second embodiment of the present invention.

FIG. 6 is a block diagram showing the drive control apparatus 200 of the present embodiment.

In the second embodiment, the electronic watch 1 having the same structure as that of the first embodiment has a different drive control apparatus 200 for the piezoelectric actuator A that drives the date display mechanism 10 thereof.

Specifically, in the first embodiment, feedback control is performed whereby the target phase difference that is the target value of the vibration state of the piezoelectric actuator A is corrected by the correction means, the target phase difference thus corrected is compared with the phase difference of the detection signal SD1 and drive voltage signal SDR, and the drive frequency of the drive voltage signal SDR is modified based on the results of this comparison.

However, the second embodiment differs in that the phase difference between the detection signal SD1 indicating the vibration state of the piezoelectric actuator A and the drive voltage signal SDR is corrected, the phase difference thus corrected is compared with the pre-set target phase difference, and feedback control is performed based on the results of this comparison. The aspects wherein the second embodiment differs from the first embodiment will be described in detail hereinafter.

[2-1. Structure of the Drive Control Apparatus of the Piezoelectric Actuator A]

The drive control apparatus 200 is provided with a drive signal supplying means 210, a phase difference detection means 220, a correction means 230 for correcting the detected phase difference, a drive frequency setting means 240 as a comparison means, and a comparison voltage setting circuit 250 for setting the target phase difference.

The drive signal supplying means 210, phase difference detection means 220, and drive frequency setting means 240 herein have the same structure as the drive signal supplying means 110, phase difference detection means 120, and drive frequency setting means 140, respectively, of the first embodiment, and the drive signal supplying means 210 is provided with a drive circuit 211 and a variable frequency oscillation circuit 212; the phase difference detection means 220 is provided with a waveform shaping circuit 221, and a phase difference/DC conversion circuit 222 as a phase difference voltage conversion circuit; and the drive frequency setting means 240 is provided with a comparison circuit 241, an integration circuit 242, and a drive control circuit as a control means not shown in the diagram. The comparison voltage setting circuit 250 is a circuit for outputting a reference voltage signal SREF corresponding to the pre-set target phase difference to the drive frequency setting means 240.

The correction means 230 is a circuit for shifting (phase difference shifting means) the phase difference detected by the phase difference detection means 220 according to the drive voltage and outputting this shifted phase difference to the drive frequency setting means 240. Specifically, the correction means shifts the phase difference by an amount commensurate with the variance when the phase difference between the detection signal SD1 and the drive voltage signal SDR varies depending on the drive voltage, and corrects the phase difference. This correction means 230 is provided with a power source voltage detection circuit 231 as a voltage detection means for detecting the power source voltage (drive voltage), a control circuit 232 for directing the amount by which the phase difference is shifted according to the power source voltage detected by the power source voltage detection circuit 131, and a phase difference shifting circuit 233 for receiving a command from the control circuit 232 and modifying the voltage value of the phase difference signal SPD corresponding to the phase difference, and outputting the modified phase difference signal SPDa to the drive frequency setting means 240.

The power source voltage detection circuit 231 is not limited to detecting the power source voltage (drive voltage), and may also be connected to the vibration detection electrode T1 of the vibrating body 12 of the piezoelectric actuator A and configured so as to detect the voltage value of the detection signal SD1 from the vibration detection electrode T1.

The drive frequency setting means 240 performs drive control for locking the drive frequency of the drive voltage signal SDR outputted from the drive signal supplying means 210 near the optimum drive frequency f0 according to design so that the difference between the phase difference shifted by the phase difference shifting circuit 233 of the correction means 230 and the target phase difference set by the comparison voltage setting circuit 250 indicates a value that is near zero. Specifically, the drive frequency setting means 240 outputs a high-level signal SCTH to the integration circuit 242 as comparison information when the voltage value of the shifted phase difference signal SPDa is at or below the reference voltage value of the reference voltage signal SREF. The drive frequency setting means also outputs a low-level signal SCTL to the integration circuit 242 as the comparison information when the voltage value of the phase difference signal SPDa is larger than the reference voltage value of the reference voltage signal SREF.

[2-2. Drive Control Method of Piezoelectric Actuator A]

The drive control method of the piezoelectric actuator A according to the drive control apparatus 200 of the present embodiment is substantially the same as the drive control method of the aforementioned first embodiment, and differs from the first embodiment in that the phase difference is shifted in step S2 of FIG. 5, and in that steps S1, S2, and S5 are repeated following steps S6A and S6B. Specifically, both at the time of drive initiation and after the vibration frequency is set to the pre-set maximum frequency fmax (step S3), the power source voltage (drive voltage) is detected by the power source voltage detection circuit 231 (step S1), the phase difference is shifted by the phase difference shifting circuit 233 based on the power source voltage thus detected (step S2), the shifted phase difference is compared with the target phase difference (step S5), and the vibration frequency is reduced or increased based on the results of this comparison (steps S6A and S6B). Feedback control whereby the drive voltage signal SDR attains a drive frequency that is near the optimum drive frequency f0, and the vibration state of the vibrating body 12 is optimally controlled is executed by repeating these steps S1, S2, S5, S6A, and S6B in sequence.

2-3 Effect of Second Embodiment

Such effects as the following are obtained in addition to the aforementioned effects (2) and (4) through (7) by the second embodiment described above.

(8) Specifically, since drive control of the piezoelectric actuator A is performed by feedback control whereby the phase difference between the detection signal SD1 and the drive voltage signal SDR is shifted by the phase difference shifting circuit 233 of the correction means 130 based on the power source voltage detected by the power source voltage detection circuit 231, the phase difference thus shifted is compared with the target phase difference, and the drive frequency of the drive voltage signal SDR is modified based on the results of this comparison, the relationship between the vibration state and the target value can be appropriately corrected, the optimum drive frequency can be applied, and high-efficiency driving can be performed even in such as case as when the vibration state of the vibrating body 12 deviates from the target value depending on the power source voltage.

(9) Furthermore, when the power source voltage decreases or fluctuates due to the operating conditions of the electronic watch 1, the time in use, and other factors, since a configuration is adopted whereby the power source voltage is detected at the time at which driving of the piezoelectric actuator A is initiated and during feedback control, and the phase difference is shifted based on this detection, drive control can be performed that circumvents the effects of this voltage fluctuation, and the appropriate level of drive efficiency of the piezoelectric actuator A can be continually maintained.

3. Third Embodiment

A third embodiment of the present invention will next be described based on FIGS. 7 through 9.

Figure 7:
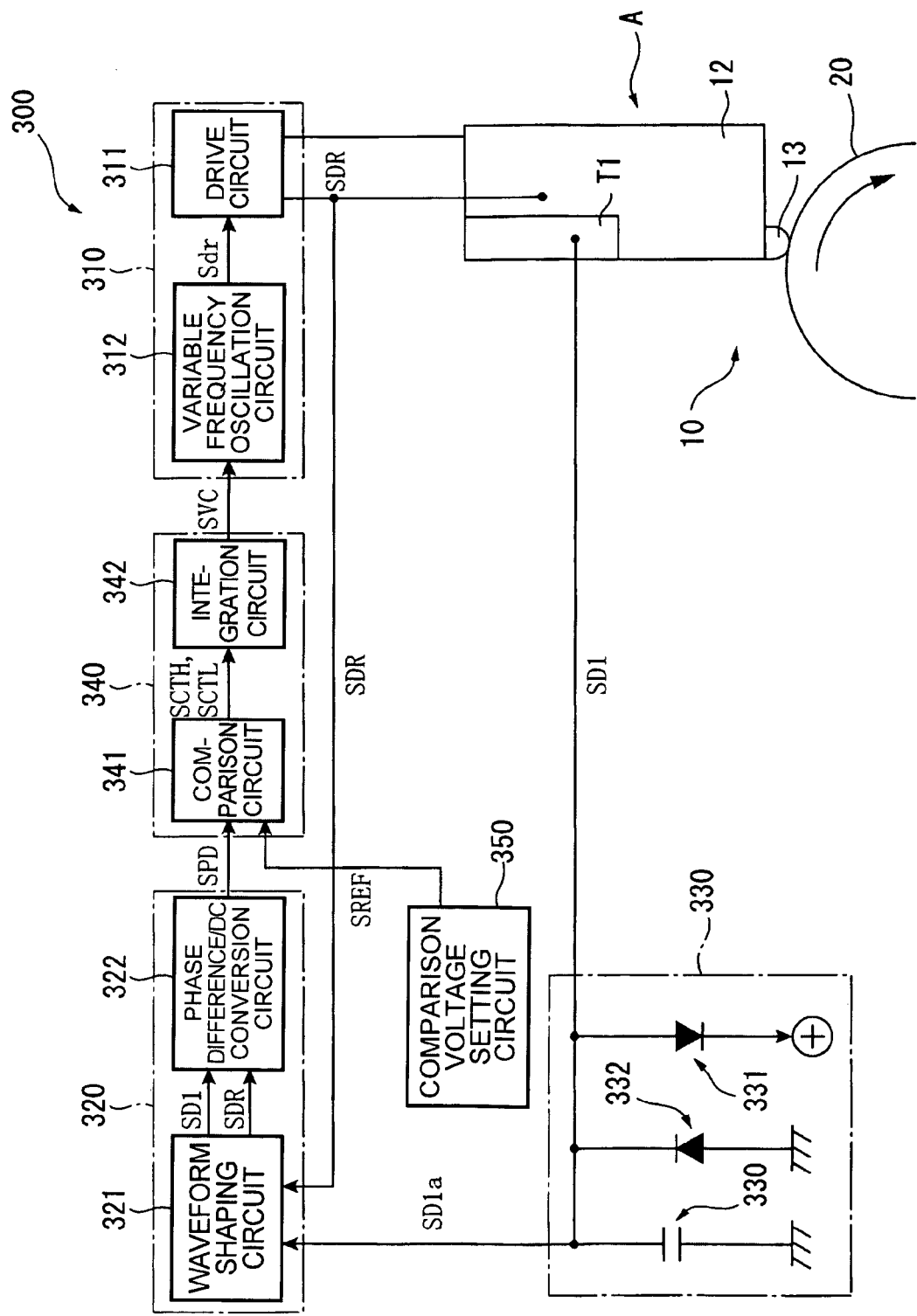
FIG. 7 is a block diagram showing the drive control apparatus for a piezoelectric actuator according to a third embodiment of the present invention.

FIG. 7 is a block diagram showing the drive control apparatus 300 of the present embodiment. FIG. 8 is a diagram showing the equivalent circuit of the phase shifting means 330 in the drive control apparatus 300. FIG. 9 is a diagram showing the relationship of the phase difference (value indicating the vibration state) between the detection signal SD1 and drive voltage signal SDR from the vibrating body 12 to the drive frequency of the drive voltage signal SDR.

The electronic watch 1 has the same configuration in the third embodiment as in the first and second embodiments described above, but differs in the third embodiment with respect to the drive control apparatus 300 of the piezoelectric actuator A for driving the date display mechanism 10.

Specifically, feedback control is performed in the first embodiment whereby the target phase difference that is the target value of the vibration state of the piezoelectric actuator A is corrected by the correction means, the target phase difference thus corrected is compared with the phase difference between the detection signal SD1 and the drive voltage signal SDR, and the drive frequency of the drive voltage signal SDR is modified based on the results of this comparison. In the second embodiment, feedback control is performed whereby the phase difference between the detection signal SD1 indicating the vibration state of the piezoelectric actuator A and the drive voltage signal SDR is corrected, the phase difference thus corrected is compared with the pre-set target phase difference, and feedback control is performed based on the results of this comparison.

However, the third embodiment differs from the above embodiments in that the phase of the detection signal SD1 indicating the vibration state of the piezoelectric actuator A is corrected, the phase difference between the phase-corrected detection signal SD1a and the drive voltage signal SDR is detected, the phase difference thus detected is compared with a pre-set target phase difference, and feedback control is performed based on the results of this comparison. The aspects wherein the present embodiment differs from the above embodiments will be described in detail hereinafter.

[3-1. Structure of the Drive Control Apparatus of the Piezoelectric Actuator A]

The drive control apparatus 300 is provided with a drive signal supplying means 310, a phase difference detection means 320, a phase shifting means 330 as correction means for correcting the phase of the detection signal SD1, a drive frequency setting means 340 as a comparison means, and a comparison voltage setting circuit 350 for setting the target phase difference.

The drive signal supplying means 310, phase difference detection means 320, drive frequency setting means 240, and comparison voltage setting circuit 350 herein have the same structure as the drive signal supplying means 110 and 210, phase difference detection means 120 and 220, drive frequency setting means 140 and 240, and comparison voltage setting circuit 250 (second embodiment), respectively, of the first and second embodiments; the drive signal supplying means 310 is provided with a drive circuit 311 and a variable frequency oscillation circuit 312; the phase difference detection means 320 is provided with a waveform shaping circuit 321, and a phase difference/DC conversion circuit 322 as a phase difference voltage conversion circuit; and the drive frequency setting means 340 is provided with a comparison circuit 341, an integration circuit 342, and a drive control circuit as a control means not shown in the diagram. The phase difference detection means 320 detects the phase difference between the drive voltage signal SDR and the detection signal SD1a whose phase has been shifted by the phase shifting means 330, and outputs a phase difference signal SPD corresponding to the phase difference thus detected to the drive frequency setting means 340.

The phase shifting means 330 is a circuit for causing a shift in the phase of the detection signal SD1 according to the drive voltage, and outputting this phase-shifted detection signal SD1a to the phase difference detection means 320. Specifically, the phase shifting means 330 shifts and corrects the phase of the detection signal SD1 according to the variation when the voltage value of the detection signal SD1 varies depending on the drive voltage. This phase shifting means 330 is provided with two diodes 331 and 332 connected between the vibration detection electrode T1 of the vibrating body 12 and the phase difference detection means 320, and a capacitor 333. One diode 331 from among the two diodes 331 and 332 is connected to the positive electrode side, and the other diode 332 and the capacitor 333 are connected to the ground.

By optimizing the size of the diodes 331 and 332, the parasitic capacitance of the diodes 331 and 332 can be used instead of the capacitor 333, and the capacitor 333 can be omitted.

Figure 8:
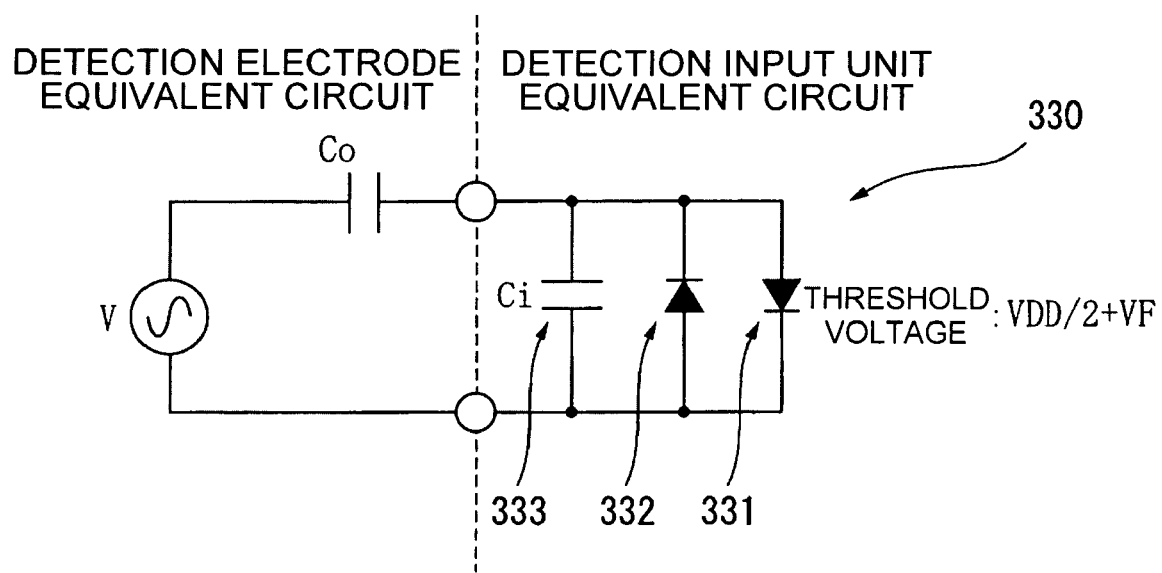
FIG. 8 is a diagram showing the equivalent circuit of the phase shifting means in the drive control apparatus.
Figure 9:
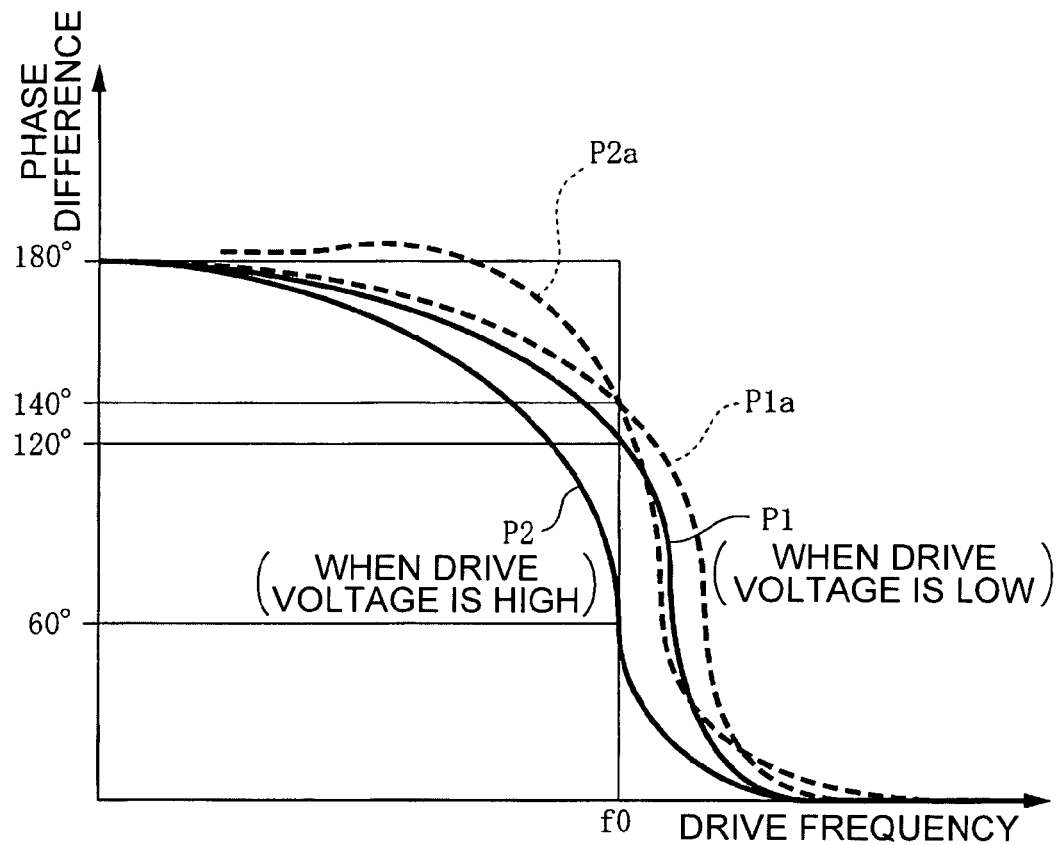
FIG. 9 is a diagram showing the vibration state in the piezoelectric actuator of the aforementioned embodiment.

The equivalent circuit of this type of phase shifting means 330 is shown in FIG. 8, and the phase of the detection signal SD1 can be shifted by such an operation as the following in this equivalent circuit.

Specifically, in the equivalent circuit in FIG. 8, since current does not flow to the diodes 331 and 332 when the voltage value V of the detection signal SD1 is at or below the threshold voltage of the diodes 331 and 332, the voltage value V of the detection signal SD1 is divided amongst the output capacity of the detection electrode and the input capacity of the capacitor 333, and the phase of the detection signal SD1 is not shifted.

When the voltage value V of the detection signal SD1 is more than the threshold voltage of the diodes 331 and 332, a current flows to the diodes 331 and 332. A circuit that is equivalent to one in which resistance is connected in parallel with the input capacity of the capacitor 333 is thus formed. The phase of the voltage occurring at the input terminal is therefore shifted with respect to the detection signal SD1.

In this arrangement, the shift θ in the phase of the detection signal SD1 when the power source voltage (drive voltage) is VDD, the threshold voltage of the diodes 331 and 332 is VF, the input capacity of the capacitor 333 is Ci, and the output capacity of the detection electrode is C0 can be indicated by equations (1) through (4) below. Specifically, when the voltage value V is at or below the threshold voltage as in equation (1), the shift θ becomes zero, as in equation (2); and when the voltage value V is greater than the threshold voltage as in equation (3), the shift θ becomes as shown in equation (4).

[Equation 1]

$$V \leq \left(\frac{Ci + Co}{Co}\right) \cdot \left(\frac{1}{2}VDD + VF\right) \quad (1)$$

[Equation 2]

$$\theta = 0 \quad (2)$$

[Equation 3]

$$V \geq \left(\frac{Ci + Co}{Co}\right) \cdot \left(\frac{1}{2}VDD + VF\right) \quad (3)$$

[Equation 4]

$$\theta = \tan^{-1}\left(\sqrt{\frac{\left(\frac{V - \left(\frac{1}{2}VDD + VF\right)}{V}\right)^2 - \left(\frac{Ci}{Ci+Co}\right)^2}{1 - \left(\frac{V - \left(\frac{1}{2}VDD + VF\right)}{V}\right)^2}}\right) \quad (4)$$

It is apparent that the phase difference between the detection signal SD1a shifted as described above and the drive voltage signal SDR is shifted towards being higher (upward in the diagram) in comparison to the phase difference between the original (not shifted) detection signal SD1 and drive voltage signal SDR. In the same diagram, the two curves P1 and P2 indicated by solid lines represent the phase difference between the non-shifted detection signal SD1 and the drive voltage signal SDR, as previously described in the first embodiment, and show the relationship of the phase difference with respect to the drive frequency when the drive voltage is comparatively low (1 V, for example) and when the drive voltage is comparatively high (2 V, for example). The two curves P1a and P2a indicated by the broken lines indicate the phase difference between the shifted detection signal SD1a and the drive voltage signal SDR when the drive voltage is comparatively low and when it is comparatively high. In the same diagram, the phase differences of curves P1a and P2a at the optimum drive frequency f0 are both approximately 140°. In this regard, the reason for the shift being larger when the drive voltage is comparatively high as opposed to when the drive voltage is comparatively low is that the voltage value of the detection signal SD1 also increases in conjunction with the drive voltage, and this is also clearly shown by the aforementioned equations.

Both when the drive voltage is low and when the drive voltage is high, the phase differences between the shifted detection signal SD1a and the drive voltage signal SDR are substantially the same at the optimum drive frequency f0. In other words, the threshold voltage of the diodes 331 and 332 of the phase shifting means 330 or the input capacity of the capacitor 333 is then set so that the phase differences are substantially the same at the optimum drive frequency f0.

Consequently, if the target phase difference set in the comparison voltage setting circuit 350 is set in advance to the phase difference (140° in the present embodiment) between the shifted detection signal SD1a and the drive voltage signal SDR at the optimum drive frequency f0, there is no need to modify the target phase difference even when the drive voltage varies, and the piezoelectric actuator A can be controlled at the optimum drive frequency by drawing a comparison with this constant target phase difference.

[3-2. Another Configuration of the Drive Control Apparatus of the Piezoelectric Actuator A]

Figure 10:
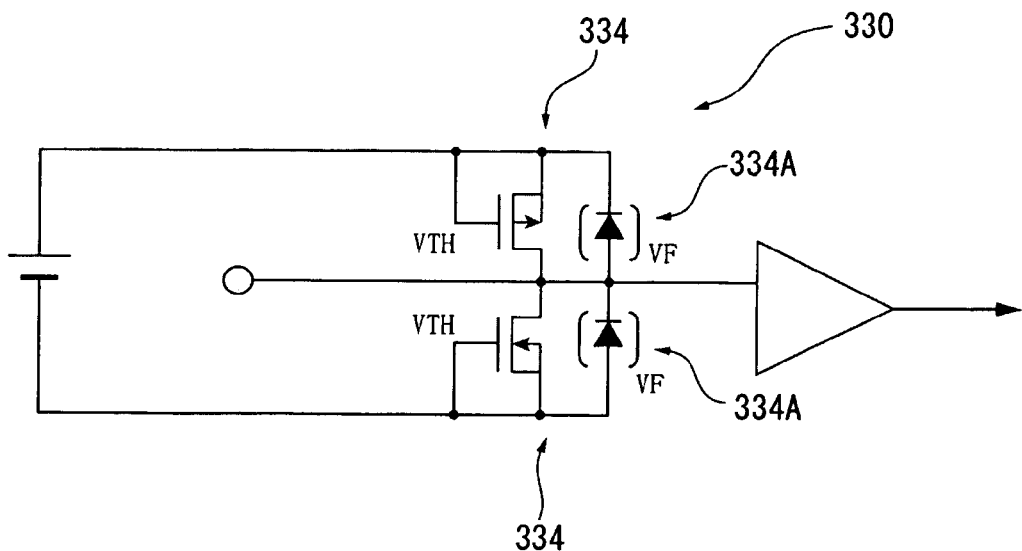
FIG. 10 is a diagram showing the equivalent circuit of the phase shifting means in another configuration of the aforementioned embodiment.

The phase shifting means 330 is not limited to the above configuration, and a configuration may also be employed therein whereby a MOS transistor 334 is used as the nonlinear element, as shown in FIG. 10.

In this arrangement, an OFF-state MOS transistor 334 may be used as the nonlinear element of the phase shifting means 330, and a parasitic diode 334A of the MOS transistor 334 may also be used.

When the OFF-state MOS transistor 334 is used, the threshold voltage VTH of the MOS transistor 334 may be set so as to be smaller than the threshold voltage VF of the parasitic diode 334A.

When the parasitic diode 334A is used, the threshold voltage VF of the parasitic diode 334A may be set so as to be smaller than the threshold voltage VTH of the MOS transistor 334. The phase of the detection signal SD1 can also be shifted in the same manner as described above by the phase shifting means 330 in which this type of MOS transistor 334 is used.

Furthermore, by optimizing the size and other characteristics of the MOS transistor, the parasitic capacitance of the MOS transistor can be used instead of the capacitor 333, and the capacitor 333 can be omitted.

[3-3. Drive Control Method of Piezoelectric Actuator A]

The drive control method of the piezoelectric actuator A according to the drive control apparatus 300 of the present embodiment is substantially the same as the drive control method of the aforementioned first embodiment, and differs from the first embodiment in that step 1 in FIG. 5 for detecting the power source voltage (drive voltage) is omitted, the phase of the detection signal SD1 is shifted in step S2, and steps S2 and S5 are repeated following steps S6A and S6B. Specifically, both at the time of drive initiation and after the vibration frequency is set to the pre-set maximum frequency fmax (step S3), the phase of the detection signal SD1 is automatically shifted by the phase shifting means 330 according to the power source voltage (drive voltage) (step S2), the phase difference between the phase-shifted detection signal SD1a and the drive voltage signal SDR is compared with the target phase difference (step S5), and the vibration frequency is reduced or increased based on the results of this comparison (steps S6A and S6B). Feedback control whereby the drive voltage signal SDR attains a drive frequency that is near the optimum drive frequency f0, and the vibration state of the vibrating body 12 is optimally controlled is executed by repeating these steps S2, S5, S6A, and S6B in sequence.

3-4. Effect of Third Embodiment

Such effects as the following are obtained in addition to the aforementioned effects (2) and (4) through (7) by the third embodiment described above.

(10) Specifically, since the phase of the detection signal SD1 is shifted by the phase shifting means 330 according to the drive voltage, and feedback control is performed based on comparison of the phase difference between this shifted detection signal SD1a and the drive voltage signal SDR to the target phase difference, the drive frequency can be quickly modified. Specifically, since the phase of the detection signal SD1 can be immediately shifted according to variation of the drive voltage, control can be performed quickly and reliably.

(11) Furthermore, when the power source voltage decreases or fluctuates due to the operating conditions of the electronic watch 1, the time in use, and other factors, since a configuration is adopted whereby the phase of the detection signal SD1 is shifted according to the power source voltage during feedback control of the piezoelectric actuator A, drive control can be performed that circumvents the effects of this voltage fluctuation, and the appropriate level of drive efficiency of the piezoelectric actuator A can be continually maintained.

(12) The circuit structure of the drive control apparatus 300 can also be simplified by forming the phase shifting means 330 using the diodes 331 and 332 or capacitor 333, the MOS transistor 334, and the like. The circuit structure can be even further simplified if the diodes 331 and 332 are also used for electrostatic protection. When the vibration detection electrode T1 of the piezoelectric actuator A is used in place of the drive electrode, the circuit can be even further simplified by using the drive transistor also as the MOS transistor of the phase shifting means 330.

4. Fourth Embodiment

A fourth embodiment of the present invention will next be described based on FIG. 11.

Figure 11:
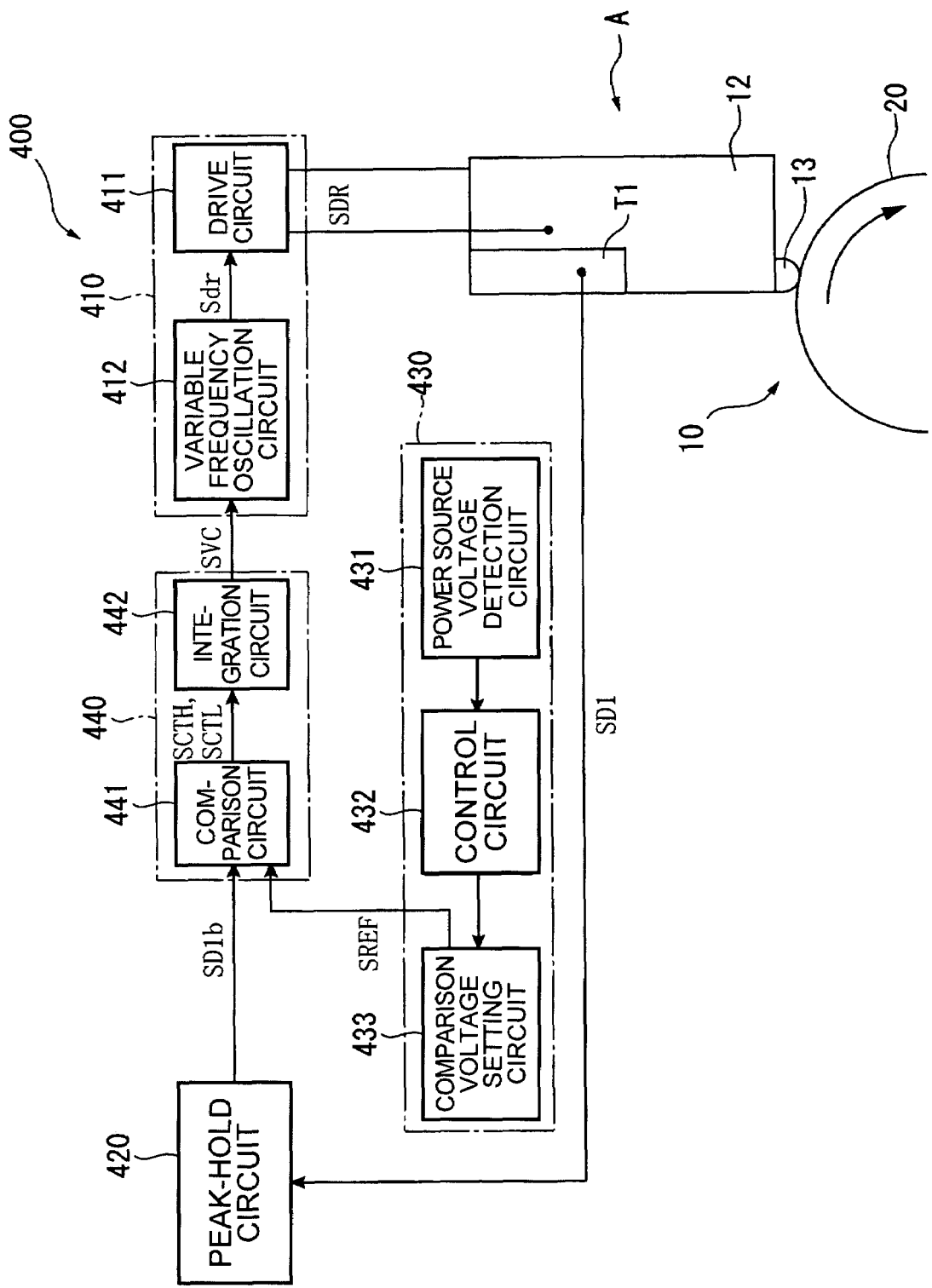
FIG. 11 is a block diagram showing the drive control apparatus for a piezoelectric actuator according to a fourth embodiment of the present invention.

FIG. 11 is a block diagram showing the drive control apparatus 400 of the present embodiment.

The electronic watch 1 has the same configuration in the fourth embodiment as in the first through third embodiments described above, but differs in the fourth embodiment with respect to the drive control apparatus 400 of the piezoelectric actuator A for driving the date display mechanism 10.

Specifically, feedback control is performed in the first through third embodiments whereby the phase difference between the detection signal SD1 indicating the vibration state of the piezoelectric actuator A and the drive voltage signal SDR is compared with the target phase difference that is the target value for the vibration state, and the drive frequency of the drive voltage signal SDR is modified based on the results of this comparison.

However, the fourth embodiment differs from the above embodiments in that the voltage value or current value of the detection signal SD1 is detected (vibration state detection means) as the value indicating the vibration state of the piezoelectric actuator A, the voltage value or current value thus detected is compared with the target value (target voltage or target current), and feedback control is performed based on the results of this comparison. The aspects in which the fourth embodiment differs from the first through third embodiments will be described in detail hereinafter.

[4-1. Structure of the Drive Control Apparatus of the Piezoelectric Actuator A]

In FIG. 11, the drive control apparatus 400 is provided with a drive signal supplying means 410, a peak-hold circuit 420 as a voltage detection means for detecting the voltage value of the detection signal SD1, a correction means 430 for correcting the target voltage that is the target value, and a drive frequency setting means 440 as comparison means for comparing the detected voltage value with the reference voltage.

The drive signal supplying means 410 and the drive frequency setting means 440 herein have the same structure as the drive signal supplying means 110, 210, and 310 and the drive frequency setting means 140, 240, and 340, respectively, of the first through third embodiments; the drive signal supplying means 410 is provided with a drive circuit 411 and a variable frequency oscillation circuit 412; and the drive frequency setting means 440 is provided with a comparison circuit 441, an integration circuit 442, and a drive control circuit as a control means not shown in the diagram.

The peak-hold circuit 420 has an op-amp or a voltage retention capacitor, detects the voltage value of the detection signal SD1 from the vibration detection electrode T1 of the vibrating body 12, retains this voltage value, and outputs the voltage value thus retained as a detection signal SD1b to the drive frequency setting means 440.

The correction means 430 is a circuit for setting the reference voltage (target voltage) that is a target value according to the drive voltage, and outputting a reference voltage signal SREF corresponding to this reference voltage to the drive frequency setting means 440. Specifically, when the drive voltage varies, the correction means modifies the reference voltage according to this variation. This correction means 430 is provided with a power source voltage detection circuit 431 as a voltage detection means for detecting the power source voltage (drive voltage), a control circuit 432 for modifying the reference voltage according to the power source voltage detected by the power source voltage detection circuit 431, and a comparison voltage setting circuit 433 as a voltage modifying means (target value setting means) for receiving a command from the control circuit 432 and outputting a reference voltage signal SREF corresponding to the modified reference voltage to the drive frequency setting means 440. The control circuit 432 outputs a control signal corresponding to the power source voltage detected by the power source voltage detection circuit 431 to the comparison voltage setting circuit 433.

The comparison voltage setting circuit 433 is composed of an up-down counter not shown in the drawing and a D/A converter, the same as the comparison voltage setting circuit 133 in the first embodiment described above, and is a circuit for outputting a reference voltage signal SREF corresponding to the set reference voltage to the drive frequency setting means 440 according to the control of the control circuit 432.

The power source voltage detection circuit 431 is not limited to detecting the power source voltage (drive voltage), and may also be connected to the vibration detection electrode T1 of the vibrating body 12 of the piezoelectric actuator A and configured so as to detect the voltage value of the detection signal SD1 from the vibration detection electrode T1.

The drive frequency setting means 440 performs drive control whereby the detection signal SD1b from the peak-hold circuit 420 and a reference voltage signal SREF corresponding to the reference voltage set by the comparison voltage setting circuit 433 of the correction means 430 are inputted, and the drive frequency of the drive voltage signal SDR outputted from the drive signal supplying means 410 is locked near the optimum drive frequency f0 according to design so that the difference between the detection signal SD1*b* and the reference voltage signal SREF indicates a value that is near zero.

[4-2. Another Configuration of the Drive Control Apparatus of the Piezoelectric Actuator A]

Figure 12:
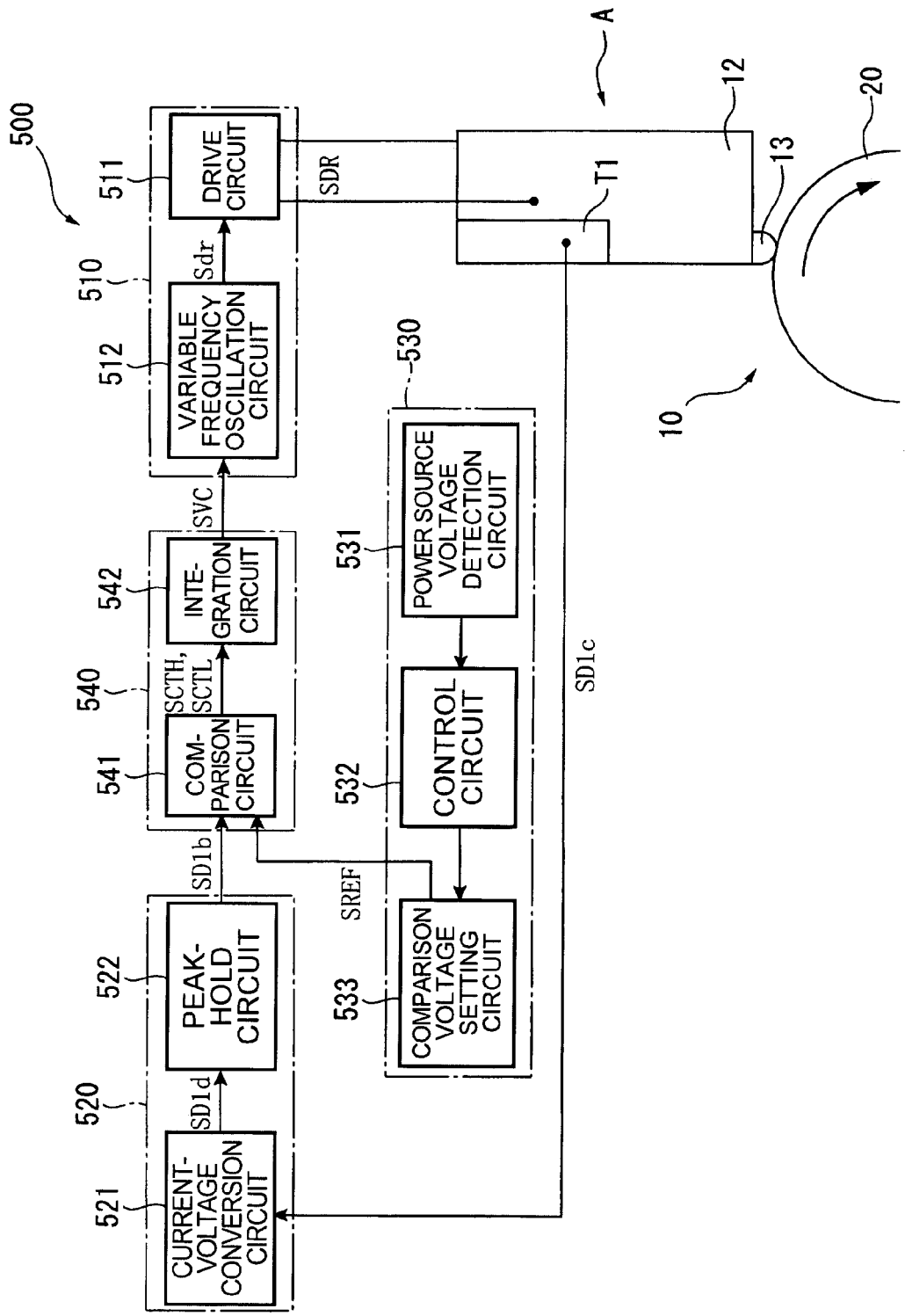
FIG. 12 is a block diagram showing the drive control apparatus in another configuration of the aforementioned embodiment.

The value indicating the vibration state of the piezoelectric actuator A is not limited to the voltage value of the detection signal SD1, and may be the current value of the detection signal SD1, and a drive control apparatus 500 as shown in FIG. 12 that is provided with a current detection means for detecting the current value may also be employed.

FIG. 12 is a block diagram showing the drive control apparatus 500 as another configuration of the present embodiment.

In FIG. 12, the drive control apparatus 500 is provided with a drive signal supplying means 510, a current detection means 520 for detecting the current value of the detection signal SD1, a correction means 530 for correcting the target current (reference current) that is the target value, and a drive frequency setting means 540 as comparison means for comparing the detected current value with the reference current.

The drive signal supplying means 510 and the drive frequency setting means 540 herein have the same structure as the previously described drive signal supplying means 410 and the drive frequency setting means 440, respectively; the drive signal supplying means 510 is provided with a drive circuit 511 and a variable frequency oscillation circuit 512; and the drive frequency setting means 540 is provided with a comparison circuit 541, an integration circuit 542, and a drive control circuit as a control means not shown in the diagram.

The current detection means 520 detects the current value (SD1*c*) of the detection signal SD1 from the vibration detection electrode T1 of the vibrating body 12, converts this current value to a voltage value, retains the result as a voltage value, and outputs the retained voltage value as a voltage signal SD1*b* to the drive frequency setting means 540. The current detection means 520 is provided with a current-voltage conversion circuit 521 for converting the current value of the detection signal SD1 to a voltage value, and a peak-hold circuit 522. The current-voltage conversion circuit 521 converts the detected current value SD1*c* to a voltage signal SD1*d* and outputs it to the peak-hold circuit 522. The peak-hold circuit 522 is the same as the peak-hold circuit 420 previously described.

The correction means 530 is a circuit for setting the reference current (target current) that is a target value according to the drive voltage, and outputting a reference voltage signal SREF corresponding to this reference current to the drive frequency setting means 540; specifically, when the drive voltage varies, the correction means 530 modifies the reference current according to this variation. This correction means 530 is provided with a power source voltage detection circuit 531 the same as described above, a control circuit 532, and a comparison voltage setting circuit 533 as a current modifying means (target value setting means) for receiving a command from the control circuit 532 and modifying the reference current, and outputting a reference voltage signal SREF in which the modified reference current is converted to a voltage to the drive frequency setting means 540. The comparison voltage setting circuit 533 is a circuit for outputting a reference voltage signal SREF corresponding to the set reference current to the drive frequency setting means 540 according to control by the control circuit 532, the same as the aforementioned comparison voltage setting circuit 433.

The power source voltage detection circuit 531 is also not limited to detecting the power source voltage (drive voltage), and may also be connected to the vibration detection electrode T1 of the vibrating body 12 of the piezoelectric actuator A and configured so as to detect the voltage value of the detection signal SD1 from the vibration detection electrode T1.

[4-3. Another Configuration of the Drive Control Apparatus of the Piezoelectric Actuator A]

Figure 13:
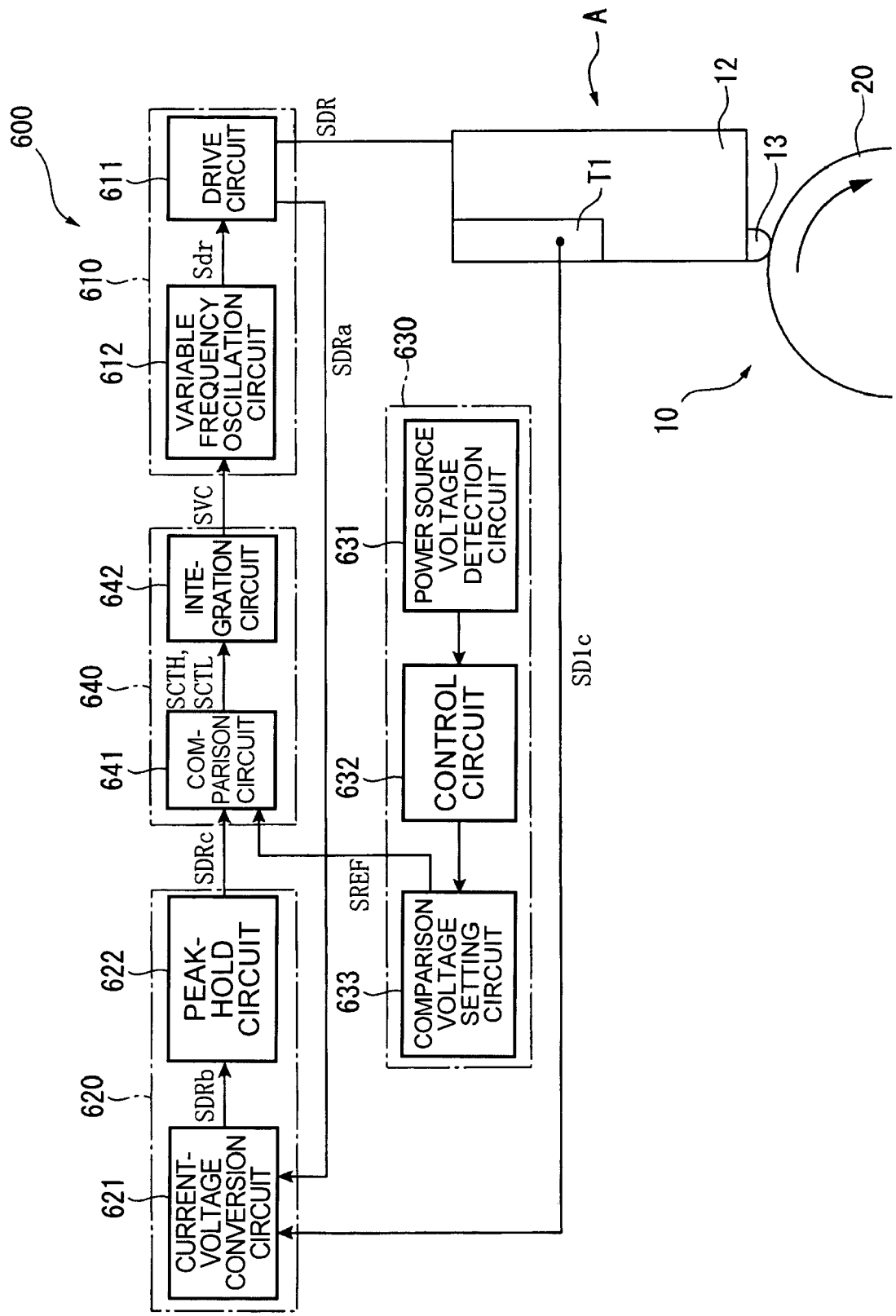
FIG. 13 is a block diagram showing the drive control apparatus in another configuration of the aforementioned embodiment.

The value indicating the vibration state of the piezoelectric actuator A is not limited to the current value of the detection signal SD1, and may be the current value of the drive signal SDR, and a drive control apparatus 600 as shown in FIG. 13 that is provided with a current detection means for detecting the current value may also be employed.

FIG. 13 is a block diagram showing the drive control apparatus 600 as another configuration of the present embodiment.

In FIG. 13, the drive control apparatus 600 is provided with a drive signal supplying means 610, a current detection means 620 for detecting the current value of the drive signal SDR, a correction means 630 for correcting the target current (reference current) that is the target value, and a drive frequency setting means 640 as comparison means for comparing the detected current value with the reference current.

The drive signal supplying means 610 and the drive frequency setting means 640 herein have the same structure as the previously described drive signal supplying means 410 and 510, and the drive frequency setting means 440 and 540, respectively; the drive signal supplying means 610 is provided with a drive circuit 611 and a variable frequency oscillation circuit 612; and the drive frequency setting means 640 is provided with a comparison circuit 641, an integration circuit 642, and a drive control circuit as a control means not shown in the diagram.

The current detection means 620 detects the current value (SDR*a*) of the drive signal SDR from the drive circuit 611, converts this current value to a voltage value, retains the result as a voltage value, and outputs the retained voltage value as a voltage signal SDR*c* to the drive frequency setting means 640. The current detection means 620 is provided with a current-voltage conversion circuit 621 for converting the current value of the drive signal SDR to a voltage value, and a peak-hold circuit 622. The current-voltage conversion circuit 621 converts the detected current value SDR*a* to a voltage signal SDR*b* and outputs it to the peak-hold circuit 622. The peak-hold circuit 622 is the same as the peak-hold circuits 420 and 520 previously described.

The correction means 630 is the same as the aforementioned correction means 530, and is a circuit for setting the reference current (target current) that is a target value according to the drive voltage, and outputting a reference voltage signal SREF corresponding to this reference current to the drive frequency setting means 640. This correction means 630 is provided with a power source voltage detection circuit 631 the same as described above, a control circuit 632, and a comparison voltage setting circuit 633. The comparison voltage setting circuit 633 is a circuit for outputting a reference voltage signal SREF corresponding to the set reference current to the drive frequency setting means 640 according to control by the control circuit 632, the same as the aforementioned comparison voltage setting circuits 433 and 533.

[4-4. Drive Control Method of the Piezoelectric Actuator A]

The drive control method of the piezoelectric actuator A by the drive control apparatuses 400, 500, and 600 of the present embodiment is substantially the same as the drive control method of the first embodiment, and differs from the first embodiment in that the reference voltage (or current) is modified in step S2 of FIG. 5, and in that the voltage signals SD1*b* and SDRc outputted from the peak-hold circuits 420, 522, and 622 are compared with the comparison voltage signal SREF from the comparison voltage setting circuits 433, 533, and 633 in step S5. Specifically, the drive voltage is outputted by the power source voltage detection circuits 431, 531, and 631 at the time of drive initiation (step S1), the reference voltage (or current) is modified by the comparison voltage setting circuits 433, 533, and 633 based on the detected power source voltage (step S2), and the vibration frequency is set to the pre-set maximum frequency fmax (step S3), after which the voltage signals SD1b and SDRc from the peak-hold circuits 420, 522, and 622 are compared with the reference voltage signal SREF (step S5), and the vibration frequency is reduced or increased based on the results of this comparison (steps S6A and S6B). Feedback control whereby the drive voltage signal SDR attains a drive frequency that is near the optimum drive frequency f0, and the vibration state of the vibrating body 12 is optimally controlled is executed by repeating these steps S5, S6A, and S6B in sequence.

A configuration may also be adopted whereby steps S1, S2, and S5 are repeated following the above steps S6A and S6B. By this configuration, the power source voltage can be continuously detected by the power source voltage detection circuits 431, 531, and 631 each time the steps are repeated, and the reference voltage (or current) can be re-set by the comparison voltage setting circuits 433, 533, and 633 based on this detection. Consequently, even when there is deviation between the voltage value (or current value) of the detection signal SD1 and the reference voltage (or current), or between the current value of the drive signal SDR and the reference current during variation in the power source voltage, it becomes possible to correct this deviation.

4-4. Effect of Fourth Embodiment

Such effects as the following are obtained in addition to the aforementioned effects (2), (5) and (7) by the second embodiment described above.

(13) Specifically, drive control of the piezoelectric actuator A is performed by feedback control whereby the reference voltage (or current) is corrected by the comparison voltage setting circuits 433, 533, and 633 based on the power source voltage detected by the power source voltage detection circuits 431, 531, and 631, this corrected reference voltage (or current) is compared with the voltage value (or current value) of the detection signal SD1 or the current value of the drive signal SDR, and the drive frequency of the drive voltage signal SDR is modified based on the results of this comparison, whereby the relationship between the vibration state and the target value can be appropriately corrected, the optimum drive frequency can be applied, and high-efficiency driving can be performed even in such as case as when the vibration state of the vibrating body 12 deviates from the target value depending on the power source voltage.

(14) Furthermore, when the power source voltage decreases or fluctuates due to the operating conditions of the electronic watch 1, the time in use, and other factors, drive control can be performed that circumvents the effects of this voltage fluctuation, and the appropriate level of drive efficiency of the piezoelectric actuator A can be continually maintained when a configuration is adopted whereby the power source voltage is detected at the time at which driving of the piezoelectric actuator A is initiated, or during feedback control, and the reference voltage (or current) is re-set based thereon.

5. Fifth Embodiment

A fifth embodiment of the present invention will next be described based on FIGS. 14 through 17.

The drive control apparatus 300 of the piezoelectric actuator A in the present embodiment is the same as that of the third embodiment, and detailed description thereof is omitted.

[5-1. Structure of Power Source and Drive Control Apparatus of Piezoelectric Actuator A]

Figure 14:
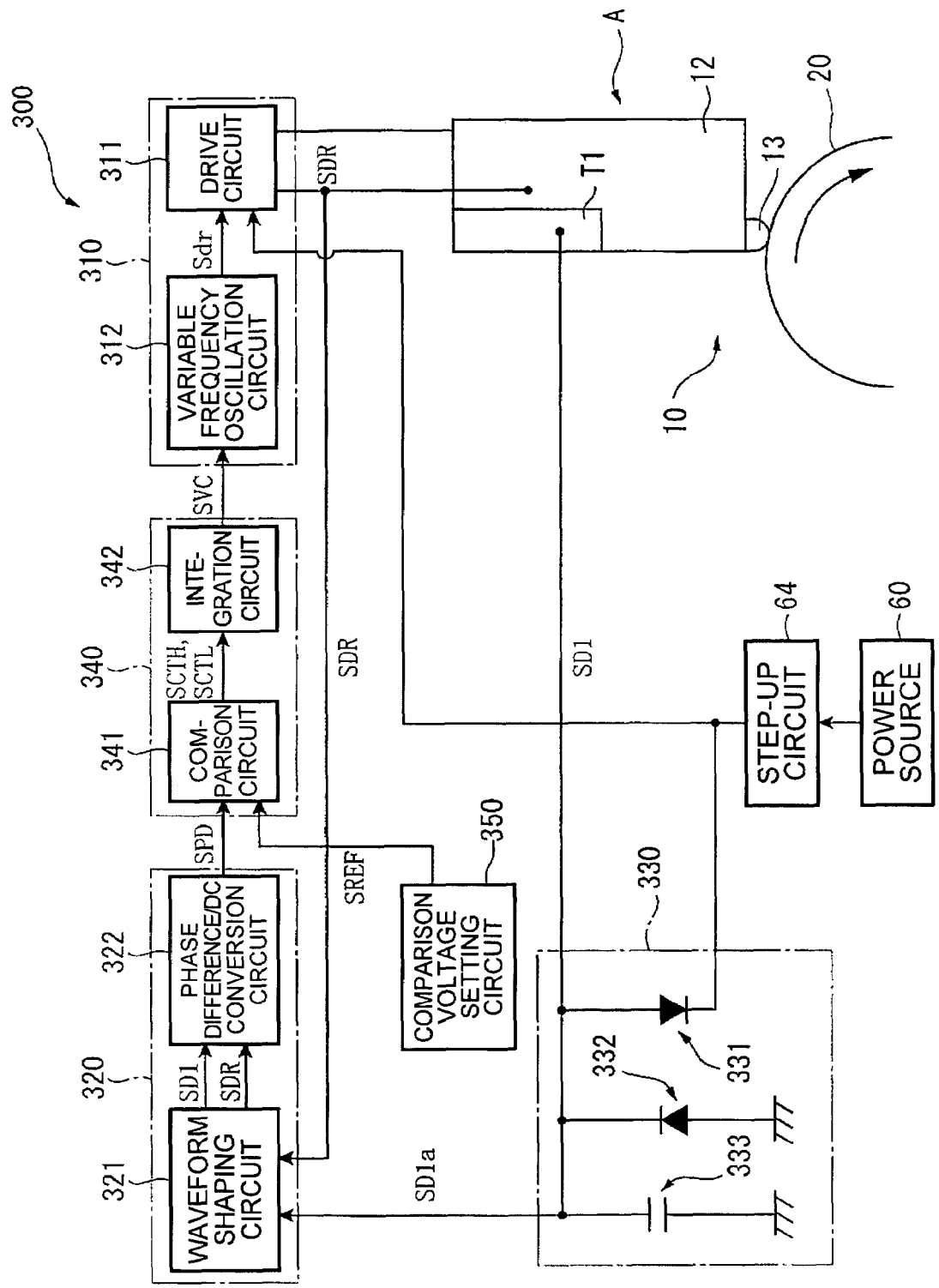
FIG. 14 is a block diagram showing the structure of the power source and drive control apparatus in the electronic device according to a fifth embodiment of the present invention.
Figure 15:
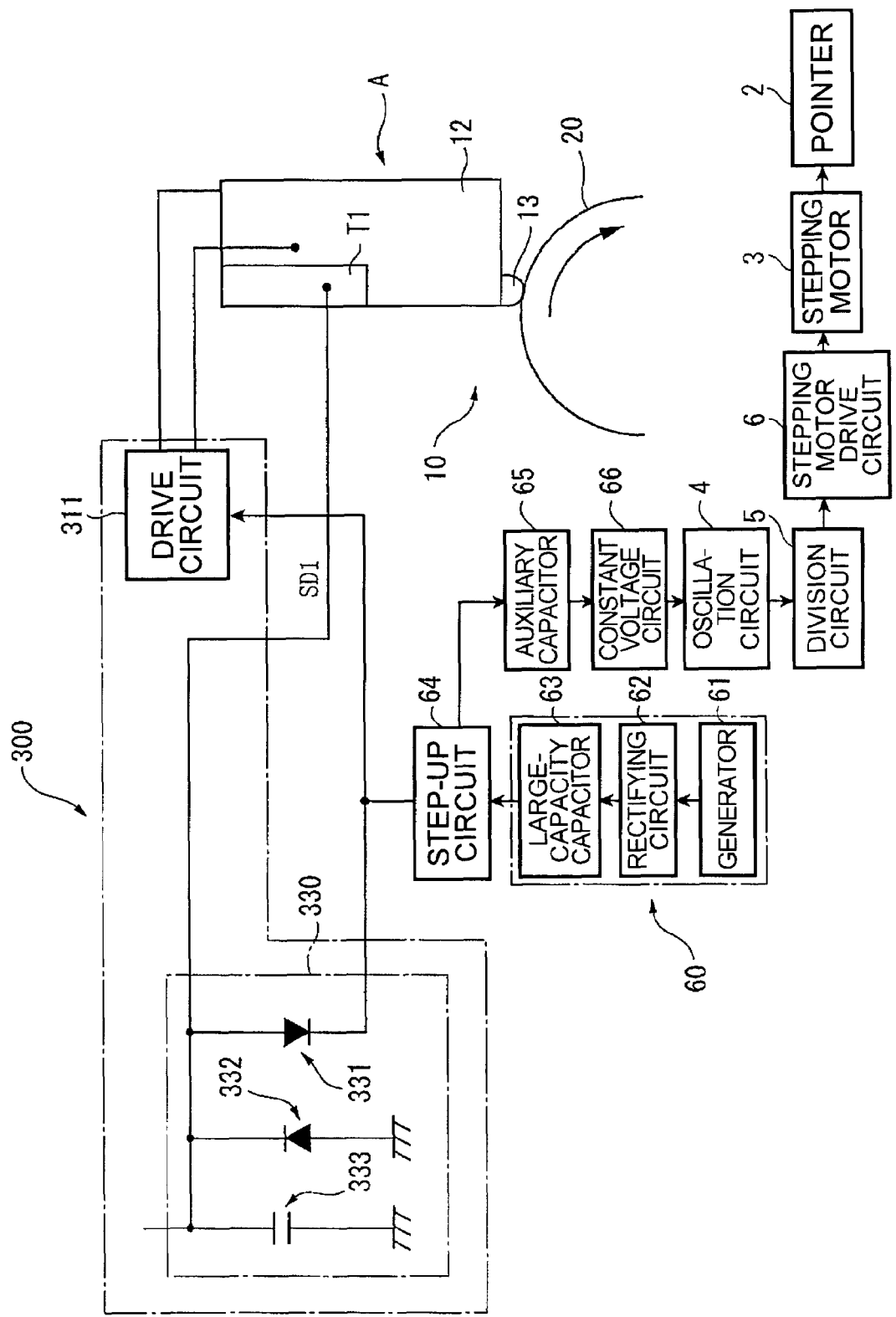
FIG. 15 is a block diagram showing the drive unit, power source, and drive control apparatus in the electronic device.

FIG. 14 is a block diagram showing the structure of the power source 60 and drive control apparatus 300 in the electronic watch 1 of the present embodiment. FIG. 15 is a block diagram showing the drive unit of the electronic watch 1, the power source 60, and the drive control apparatus 300, and the area around the power source 60 of FIG. 14 is depicted in more detail therein.

In FIGS. 14 and 15, the power source 60 of the electronic watch 1 is connected via a step-up circuit 64 to the diode 331 of the phase shifting means 330 and to the drive circuit 311 of the drive signal supplying means 310 in the drive control apparatus 300. As shown in FIG. 15, this power source 60 has a generator 61, a rectifying circuit 62, and a large-capacity capacitor 63. A generating apparatus that uses a solar cell or oscillating weight, a generating apparatus driven by a power spring, or the like may be used as the generator 61, and the output from the generator 61 is rectified through a rectifying circuit 62 composed of a step-up rectifier, a full-wave rectifier, a half-wave rectifier, a transistor rectifier, or the like and fed into the large-capacity capacitor 63. When a solar cell for generating direct-current power is used as the generator 61, the rectifying circuit 62 may be omitted, and the solar cell may be connected to the large-capacity capacitor 63 via a backflow prevention circuit. The drive voltage in which the power source voltage fed into the large-capacity capacitor 63 is stepped up by the step-up circuit 64 is applied to the diode 331 and the drive circuit 311 of the piezoelectric actuator A. By applying the drive voltage via the large-capacity capacitor 63 and the step-up circuit 64 in this manner, the drive voltage stepped up by the step-up circuit 64 can be applied to the piezoelectric actuator A, and the piezoelectric actuator A can be driven with even higher efficiency in keeping with the structure of the aforementioned drive control apparatus 300.

In the oscillation circuit 4, division circuit 5, drive circuit 6, and stepping motor 3 that constitute the drive unit of the electronic watch 1, the power source voltage stepped up by the step-up circuit 64 is temporarily fed into an auxiliary capacitor 65, and the power source voltage thus charged is applied via a constant voltage circuit 66. By applying the power source voltage stepped up by the step-up circuit 64 to the oscillation circuit 4 via the auxiliary capacitor 65 and constant voltage circuit 66 as described above, the oscillation frequency of the reference pulse outputted from the oscillation circuit 4 can be stabilized. Since the power source voltage applied to the oscillation circuit 4 becomes less susceptible to the effects of the drive load of the date display mechanism 10, a stable voltage can be supplied to the drive unit of the electronic watch 1, and the movement of the pointer 2 can be stabilized. Specifically, the date display mechanism 10 of the electronic watch 1 driven by the piezoelectric actuator A as described above is operated with the 24:00 detection switch 8 as a trigger, and is stopped after being operated for one day's worth of rotation of the date indicator 50. The load on the power source 60 therefore increases during operation of the date display mechanism 10, but since the voltage thereof is transmitted via the auxiliary capacitor 65 and the constant voltage circuit 66, a stable voltage can be applied to the drive unit of the electronic watch 1.

[5-2. Another Configuration of the Power Source and Drive Control Apparatus of the Piezoelectric Actuator A]

Figure 16:
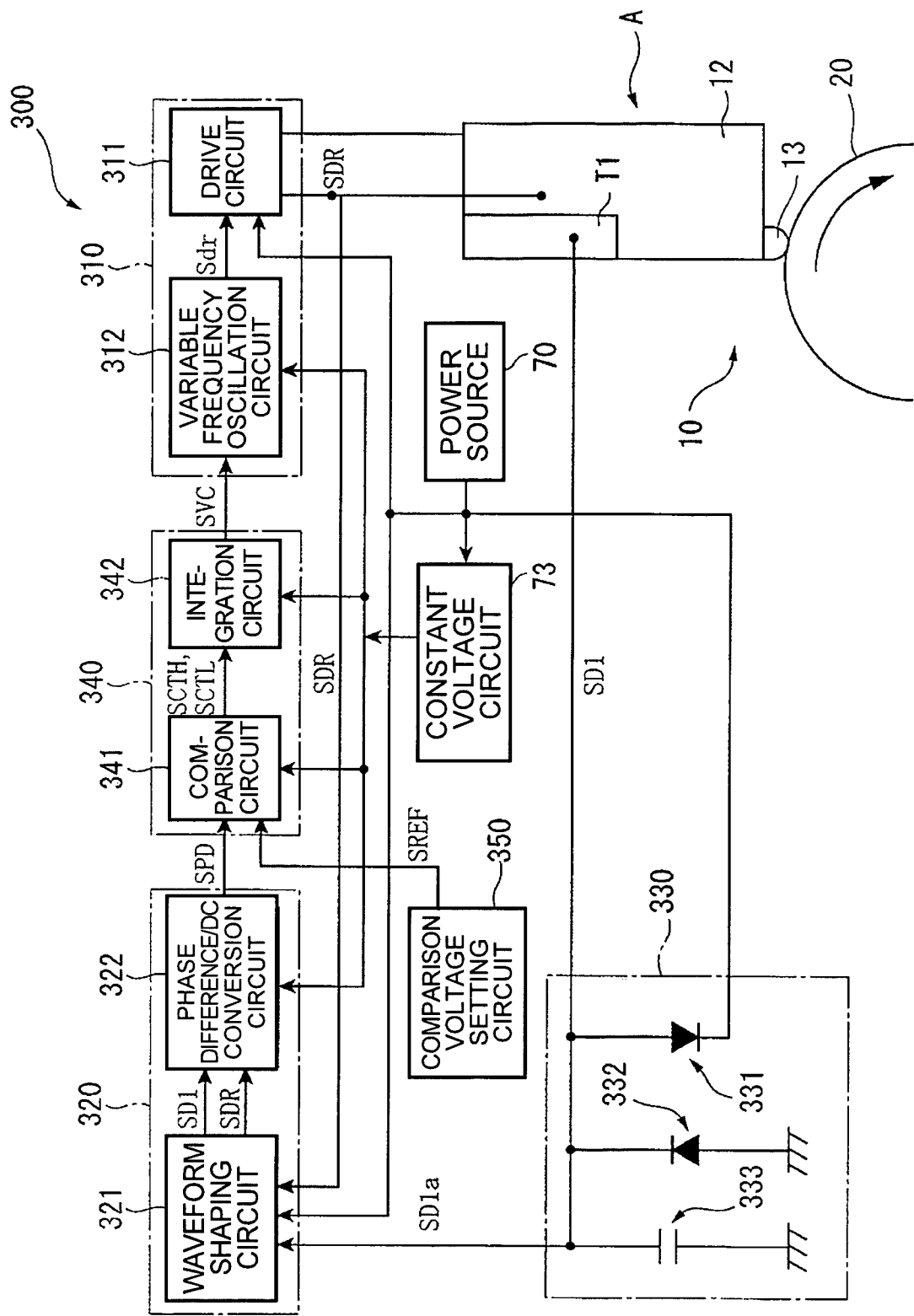
FIG. 16 is a block diagram showing the structure of the power source and drive control apparatus in another configuration of the aforementioned embodiment.
Figure 17:
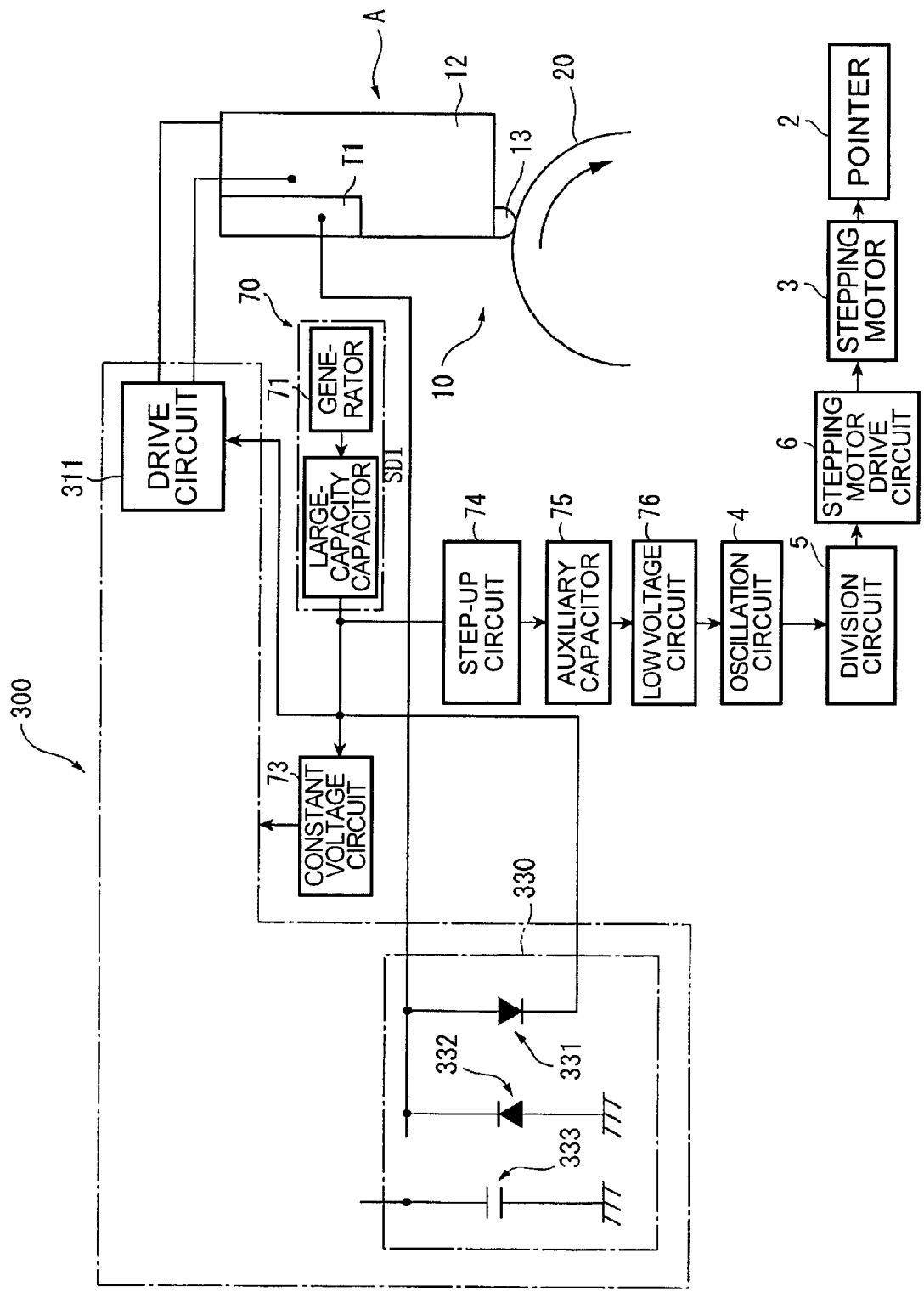
FIG. 17 is a block diagram showing the drive unit, power source, and drive control apparatus in the other configuration.

The configuration of the power source and the drive control apparatus of the piezoelectric actuator A is not limited to the above configuration, and configurations such as the ones shown in FIGS. 16 and 17 may also be employed.

FIG. 16 is a block diagram showing another configuration of the power source 70 and drive control apparatus 300 in the present embodiment. FIG. 17 is a block diagram showing the drive unit of the electronic watch 1, the power source 60, and the drive control apparatus 300 in another configuration, and the area around the power source 60 of FIG. 14 is depicted in more detail therein.

In FIGS. 16 and 17, the power source 70 of the electronic watch 1 is connected to the diode 331 of the phase shifting means 330, to the drive circuit 311 of the drive signal supplying means 310, and to the waveform shaping circuit 321 of the phase difference detection means 320 in the drive control apparatus 300. Furthermore, the power source 70 is connected via a constant voltage circuit 73 to the phase difference/DC conversion circuit 322 of the phase difference detection means 320, to the comparison circuit 341 and integration circuit 342 of the drive frequency setting means 340, and to the variable frequency oscillation circuit 312 of the drive signal supplying means 310. As shown in FIG. 17, this power source 70 has a generator 71 and a large-capacity capacitor 72, and the alternating current output from the generator 71 is fed into the large-capacity capacitor 72. The power source voltage fed into the large-capacity capacitor 72 is then applied to the circuits 322, 341, 342, and 312 of the drive control apparatus 300 via the constant voltage circuit 73.

As in FIG. 15 described above, in the oscillation circuit 4, division circuit 5, drive circuit 6, and stepping motor 3 that constitute the drive unit of the electronic watch 1, the power source voltage fed into the large-capacity capacitor 72 is first stepped up by the step-up circuit 64 and then fed into an auxiliary capacitor 75, and the power source voltage thus fed is applied via the constant voltage circuit 76. The oscillation frequency of the reference pulse outputted from the oscillation circuit 4 can thereby be stabilized in the same manner as previously mentioned.

6. Sixth Embodiment

A sixth embodiment of the present invention will next be described based on FIGS. 18 and 19.

The present embodiment differs from the first through fifth embodiments in that the drive control apparatus 100, 200, 300, 400, 500, and 600 are used in a portable electronic device, but the structure of the drive apparatus of the piezoelectric actuator is the same as in each of the aforementioned embodiments. In the description of the sixth embodiment, constituent elements that are the same as in the aforementioned embodiments are assigned the same symbols, and description thereof is shortened or omitted.

[6-1. Structure of Electronic Device]

In the present embodiment, the electronic device (portable device) is a non-contact IC card 700, and this IC card 700 is provided with a piezoelectric actuator A and a drive apparatus 710.

Figure 18:
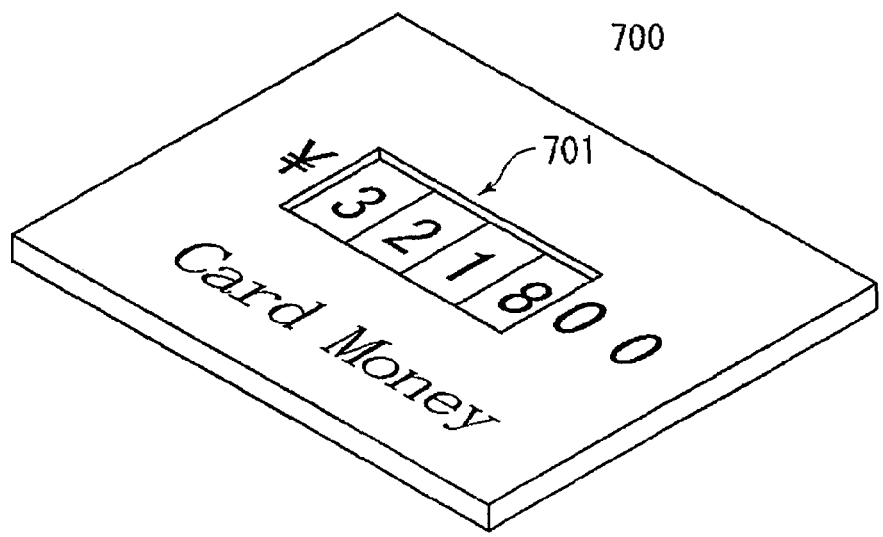
FIG. 18 is a perspective view showing the electronic device according to a sixth embodiment of the present invention.
Figure 19:
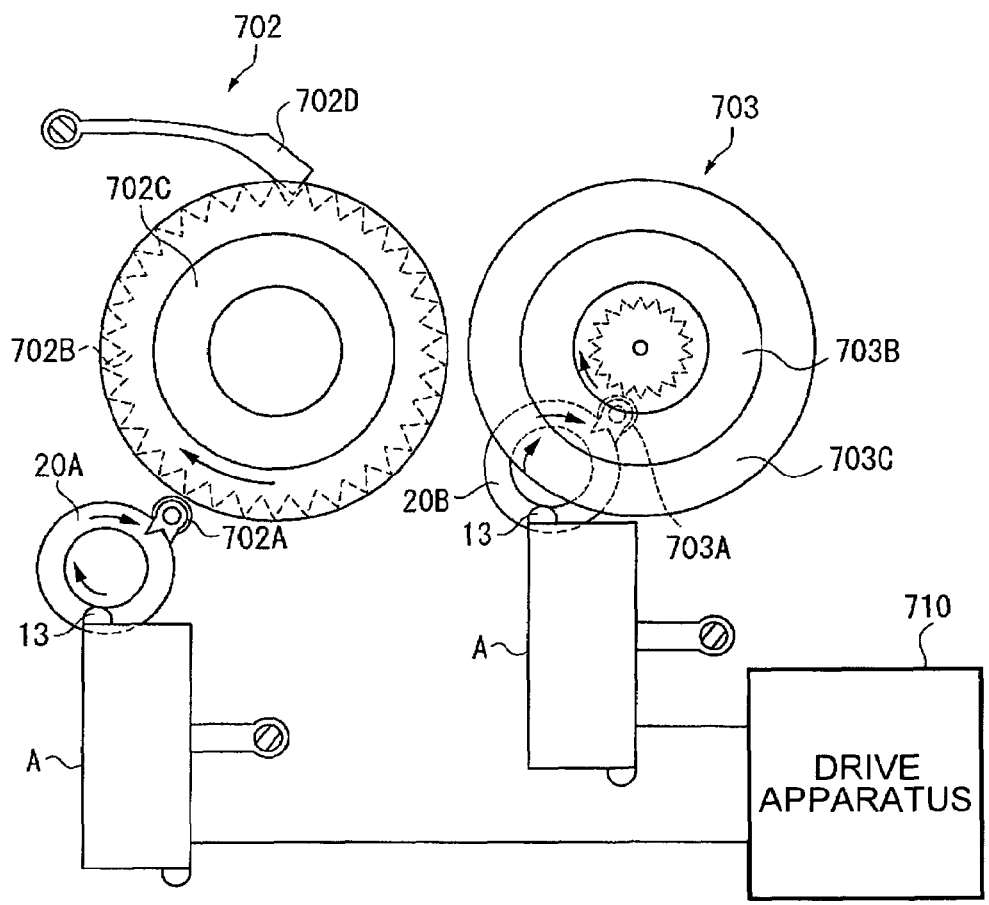
FIG. 19 is a front view of the detailed structure of the electronic device, showing the column display unit therein.

FIG. 18 is a perspective view of the outside of the non-contact IC card 700.

In FIG. 18, a balance display counter 701 for displaying a balance is provided to the surface of the non-contact IC card 700.

The balance display counter 701 displays a four-figure balance, and is provided with a high-order display unit 702 for displaying the upper two decimal places, and a low-order display unit 703 for displaying the lower two decimal places.

The high-order display unit 702 is connected to the piezoelectric actuator A via a rotor 20A, and is driven by the driving force of the rotor 20A. The high-order display unit 702 is provided with principal components that include a drive gear 702A that has an advancing tooth and that rotates once when the rotor 20A completes 1/n rotations, a first high-order display wheel 702B that rotates by one graduation for each rotation of the drive gear 702A, a second high-order display wheel 702C that rotates by one graduation for each rotation of the first high-order display wheel 702B, and a fixing member 702D for fixing the first high-order display wheel 702B when the first high-order display wheel 702B is not rotating. A fixing member not shown in the diagram is also provided for fixing the second high-order display wheel 702C, the same as for the first high-order display wheel 702B.

The drive gear 702A rotates once when the rotor 20A completes 1/n rotations. The advancing tooth of the drive gear 702A meshes with the advancing gear unit of the first high-order display wheel 702B, whereby the first high-order display wheel 702B rotates by one graduation. Furthermore, when the first high-order display wheel 702B rotates through one rotation, an advancing pin provided to the first high-order display wheel 702B rotates the advancing gear, the advancing gear of the second high-order display wheel 702C is caused to rotate, and the second high-order display wheel 702C is rotated by one graduation.

The low-order display unit 703 is connected to the piezoelectric actuator A via a rotor 20B, and is driven by the driving force of the rotor 20B. The low-order display unit 703 is provided with principal components that include a drive gear 703A that has an advancing tooth and that rotates once when the rotor 20B completes 1/n rotations, a first low-order display wheel 703B that rotates by one graduation for each rotation of the drive gear 703A, and a second low-order display wheel 703C that rotates by one graduation for each rotation of the first low-order display wheel 703B.

The first low-order display wheel 703B has an advancing gear unit that meshes with the advancing tooth of the drive gear 703A, and rotates by one graduation for each rotation of the drive gear 703A. The first low-order display wheel 703B is provided with an advancing pin, and each time the first low-order display wheel 703B rotates, the advancing gear is rotated, and the second low-order display wheel 703C is rotated by one graduation. In this case, the fixing member (not shown in the diagram) of the first low-order display wheel 703B and the second low-order display wheel 703C meshes with the respective advancing gear units thereof when the wheels are not rotating, and immobilizes the first low-order display wheel 703B and the second low-order display wheel 703C.

In the non-contact IC card 700 described above, the piezoelectric actuator A is set so as to be driven in synchrony by the drive apparatus 710, and the drive apparatus 710 is driven by the input of a drive control signal that corresponds to a settlement amount by an IC card chip not shown in the diagram. Since the specific structure of this drive apparatus 710 is the same as that of the drive control apparatus 100, 200, 300, 400, 500, and 600 in the previously described embodiments, description thereof is omitted.

By such a configuration as described above, the display of a monetary balance can be performed mechanically even in a narrow-profile portable device such as a non-contact IC card, and since displaying can be performed without the need for a power source at times other than when the device is driven, displaying can be performed by a product that uses little power, and even when the power source is no longer present, the display up to that point can be maintained.

7. Modifications of Embodiments

The present invention is not limited by the aforementioned embodiments, and such modifications as those described below are included therein.

For example, a wristwatch electronic watch 1 and a non-contact IC card 700 were described in the aforementioned embodiments, but the electronic watch is not limited to a wristwatch, and may also be a standing clock or a wall clock. The electronic device is also not limited to an electronic watch or an IC card, and it is possible to apply the present invention to various types of electronic devices. The present invention is particularly suitable for portable electronic devices in which small size is required. Examples of various types of electronic devices herein may include telephones provided with timekeeping ability, portable telephones, personal computers, portable information terminals (PDA), cameras, and the like. The present invention is also applicable to cameras, digital cameras, video cameras, camera-phones, and other electronic devices not provided with timekeeping ability. When the present invention is applied to these electronic devices provided with camera functionality, the piezoelectric actuator of the present invention can be used for driving a lens focusing mechanism, zoom mechanism, aperture adjustment mechanism, or the like. Furthermore, the piezoelectric actuator of the present invention may be used in the drive mechanism of a meter pointer for a measuring device, the drive mechanism of a movable toy, or the like.

A piezoelectric actuator A was used for driving the date display mechanism 10 of an electronic watch 1 in the aforementioned embodiments, but this configuration is not limiting, and the hour display hand (pointer) of the electronic watch 1 may also be driven by the piezoelectric actuator A. By this type of configuration, since the stepping motor 3 for driving the pointer is replaced by the piezoelectric actuator A, the electronic watch can be made with an even narrower profile, and since the piezoelectric actuator A is less affected by magnetism than the stepping motor, high resistance to magnetism can be anticipated in the electronic watch.

Furthermore, the various means and the like in the drive control apparatus 100, 200, 300, 400, 500, and 600 were composed of various types of logic circuit elements and other hardware in the present invention, but this configuration is not limiting, and a configuration may be adopted whereby a computer provided with a CPU (central processing apparatus), memory (storage device), and the like is provided in the electronic device, a prescribed program or data (data stored in various storage units) is incorporated into the computer, and the functions of the various means are performed.

In this arrangement, the program or data may be stored in advance in RAM, ROM, or other memory built into the electronic device. The prescribed control program or data may also be installed in the memory of the electronic device via the Internet or another communication means, or a CD-ROM, memory card, or other storage medium. The CPU and the like may be operated by a program stored in the memory, and the functions of the various means performed. Installation of the prescribed program or the like into the clock or portable device may be performed by directly inserting a memory card, CD-ROM, or the like into the clock or portable device, or a device for reading these storage media may be connected to the clock or portable device from the outside. Furthermore, a LAN cable, telephone cable, or the like may be connected to the clock or portable device, and the program or the like fed to and installed therein by wired communication, or the program may be fed to and installed therein in wireless fashion.

The terms "in front of," "behind," "above," "below," "perpendicular," "horizontal," "slanted," and other terms used above for indicating directions refer to directions in the drawings used in the description. Therefore, these terms for indicating directions used for description of the present invention should be interpreted in corresponding fashion alongside the drawings used.

The terms "substantially," "approximately," "generally," and other terms for indicating extents in the above description indicate appropriate amounts of deviation that are of such magnitude as they do not ultimately bring about significant changes in the present invention. These terms for indicating extents should be interpreted as including at least about ±5% error, insofar as no significant change is brought about by this deviation.

This specification claims priority of Japanese Patent Application No. 2004-067562. All disclosures of Japanese Patent Application No. 2004-067562 are incorporated herein by reference.

Only some working examples of the present invention are described above, but it is clear that one skilled in the art may add various modifications to the above working examples according to the above disclosure without exceeding the range of the present invention as defined in the claims. Furthermore, the examples described above are intended only to describe the present invention, and do not limit the range of the present invention as defined by the claims hereinafter or by equivalent claims.

What is claimed is:

1. A piezoelectric actuator drive apparatus for driving a piezoelectric actuator having a vibrating body that vibrates due to application of a drive signal having a prescribed drive frequency to a piezoelectric element, said piezoelectric actuator driving a driven member, said piezoelectric actuator drive apparatus comprising:

driving means for supplying said drive signal to the piezoelectric element of said vibrating body;

vibration state detection signal outputting means for outputting a vibration state detection signal that indicates vibration state of said vibrating body;

phase correcting means for correcting a phase of said vibration state detection signal to corrected phase, on the basis of voltage of said vibration state detection signal;

phase difference detection means for detecting phase difference between said phase of drive signal and said corrected phase;

comparison means for comparing said phase difference with a target phase difference which is a target to optimize said vibration state at which the vibrating body is efficiently driven; and control means for controlling said phase difference to approach said target phase difference by changing said drive frequency.

2. The piezoelectric actuator drive apparatus according to claim 1, wherein said phase correcting means includes a capacitor or a parasitic capacitance of an MOS transistor and at least one of a diode, a parasitic diode of an MOS transistor and an off-state transistor, and said phase correcting means corrects said phase of the vibration state detection signal to a corrected phase when a voltage of said vibration state detection signal is more than a threshold voltage of at least said one of said diode, said parasitic diode of said MOS transistor, and said off-state transistor after being used.

* * * * *